United States Patent
Kondo

(10) Patent No.: US 10,038,305 B2
(45) Date of Patent: Jul. 31, 2018

(54) LIGHT EMITTING COMPONENT, PRINT HEAD, AND IMAGE FORMING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

(*) Notice: Subject to any disclaimer, the term of this patent is extended or adjusted under 35 U.S.C. 154(b) by 0 days.

(21) Appl. No.: 15/460,828

(22) Filed: Mar. 16, 2017

(65) Prior Publication Data
US 2017/0277065 A1   Sep. 28, 2017

(30) Foreign Application Priority Data
Mar. 22, 2016   (JP) ................... 2016-057576

(51) Int. Cl.
| | |
|---|---|
| G03G 15/04 | (2006.01) |
| H01L 27/15 | (2006.01) |
| H01S 5/22 | (2006.01) |
| H01L 29/74 | (2006.01) |
| H01L 33/06 | (2010.01) |
| H01L 33/14 | (2010.01) |
| H01L 33/30 | (2010.01) |
| H01L 33/10 | (2010.01) |
| H01L 29/8605 | (2006.01) |
| H01S 5/026 | (2006.01) |

(Continued)

(52) U.S. Cl.
CPC ..... *H01S 5/2205* (2013.01); *G03G 15/04054* (2013.01); *H01L 27/15* (2013.01); *H01L 27/153* (2013.01); *H01L 29/74* (2013.01); *H01L 29/8605* (2013.01); *H01L 33/06* (2013.01); *H01L 33/105* (2013.01); *H01L 33/145* (2013.01); *H01L 33/30* (2013.01); *H01S 5/0261* (2013.01); *H01S 5/3095* (2013.01); *H01L 29/201* (2013.01); *H01S 5/0427* (2013.01); *H01S 5/18308* (2013.01); *H01S 5/2222* (2013.01); *H01S 5/3216* (2013.01); *H01S 5/4031* (2013.01); *H01S 5/423* (2013.01)

(58) Field of Classification Search
CPC .............. H01S 5/2205; G03G 15/04054
USPC ............................................ 399/221
See application file for complete search history.

(56) References Cited

U.S. PATENT DOCUMENTS

| 5,451,977 A | 9/1995 | Kusuda et al. |
| 2009/0297223 A1 | 12/2009 | Suzuki |

(Continued)

FOREIGN PATENT DOCUMENTS

| JP | 01-238962 A | 9/1989 |
| JP | 2001-308385 A | 11/2001 |
| JP | 2009-286048 A | 12/2009 |

*Primary Examiner* — Walter L Lindsay, Jr.
*Assistant Examiner* — Philip Marcus T Fadul
(74) *Attorney, Agent, or Firm* — Sughrue Mion, PLLC

(57) ABSTRACT

A light emitting component includes plural transfer elements, plural setting thyristors, and plural light emitting elements. The transfer elements are configured to be sequentially brought into an ON state. The setting thyristors are connected to the transfer elements, respectively. The setting thyristors are configured to be brought into a state where the setting thyristors are capable of changing to the ON state when the transfer elements are brought into the ON state. The light emitting elements are stacked on the setting thyristors through tunnel junctions, respectively. The light emitting elements are configured to emit light of increase a light emission amount when the setting thyristors are brought into the ON state.

17 Claims, 26 Drawing Sheets

(51) Int. Cl.
    *H01S 5/30*        (2006.01)
    *H01L 29/201*    (2006.01)
    *H01S 5/042*     (2006.01)
    *H01S 5/183*     (2006.01)
    *H01S 5/32*       (2006.01)
    *H01S 5/40*       (2006.01)
    *H01S 5/42*       (2006.01)

(56) References Cited

U.S. PATENT DOCUMENTS

2013/0087788 A1*   4/2013   Nakamura  .............. H01L 22/14
                                                                              257/48
2014/0023399 A1*   1/2014   Ohno  ........................ B41J 2/45
                                                                              399/220

\* cited by examiner

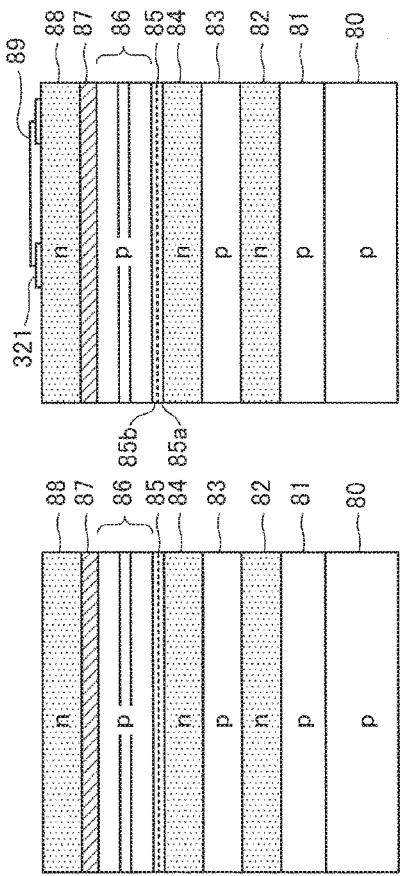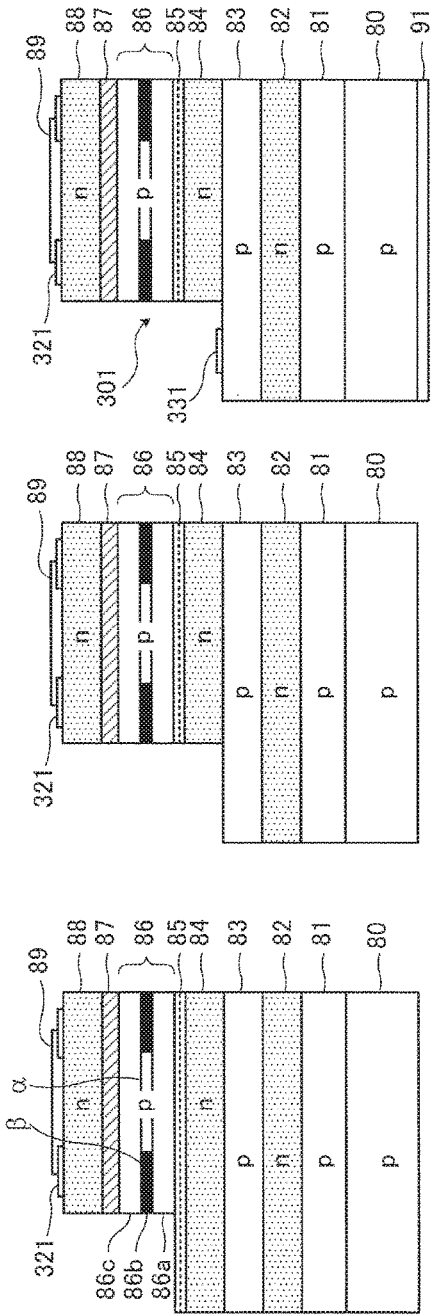

LIGHT EMITTING COMPONENT, PRINT HEAD, AND IMAGE FORMING APPARATUS

CROSS-REFERENCE TO RELATED APPLICATIONS

This application is based on and claims priority under 35 USC 119 from Japanese Patent Application No. 2016-057576 filed Mar. 22, 2016.

BACKGROUND

Technical Field

The present invention relates to a light emitting component, a print head, and an image forming apparatus.

SUMMARY

According to an aspect of the invention, a light emitting component includes plural transfer elements, plural setting thyristors, and plural light emitting elements. The transfer elements are configured to be sequentially brought into an ON state. The setting thyristors are connected to the transfer elements, respectively. The setting thyristors are configured to be brought into a state where the setting thyristors are capable of changing to the ON state when the transfer elements are brought into the ON state. The light emitting elements are stacked on the setting thyristors through tunnel junctions, respectively. The light emitting elements are configured to emit light or increase a light emission amount when the setting thyristors are brought into the ON state.

BRIEF DESCRIPTION OF THE DRAWINGS

Exemplary embodiments of the present invention will be described in detail based on the following figures, wherein:

FIGS. 6A and 6B are views illustrating examples of a top plan layout view and a cross-sectional view of the light emitting chip according to the first exemplary embodiment, in which FIG. 6A is a top plan layout view of the light emitting chip, and FIG. 6B is a cross-sectional view taken along line VIB-VIB in FIG. 6A;

FIGS. 8A to 8C are views illustrating for further explaining a stack structure of the setting thyristor and the light emitting diode, in which FIG. 8A is a schematic energy band diagram with regard to the stack structure of the setting thyristor and the light emitting diode, FIG. 8B is an energy band diagram of a tunnel junction layer being in a reverse bias state, and FIG. 8C illustrates current and voltage characteristics of the tunnel junction layer;

FIGS. 10A to 10F are views for explaining a method of manufacturing the light emitting chip, in which FIG. 10A illustrates a process of forming a semiconductor stacked bode, FIG. 10B illustrates a process of forming an n ohmic electrode and a light emission port protective layer, FIG. 10C illustrates an etching process of exposing the tunnel junction layer, FIG. 10D illustrates a process of forming a current blocking part with regard to a current confining layer, FIG. 10E illustrates an etching process of exposing a p gate layer, and FIG. 10F illustrates a process of forming a p ohmic electrode and a back electrode;

DETAILED DESCRIPTION

Hereinafter, exemplary embodiments of the present invention will be described in detail with reference to the accompanying drawings.

Hereinafter, symbols of elements are used in a description. For example, aluminum may be referred to as Al.

First Exemplary Embodiment (Image Forming Apparatus 1)

Figure 1:
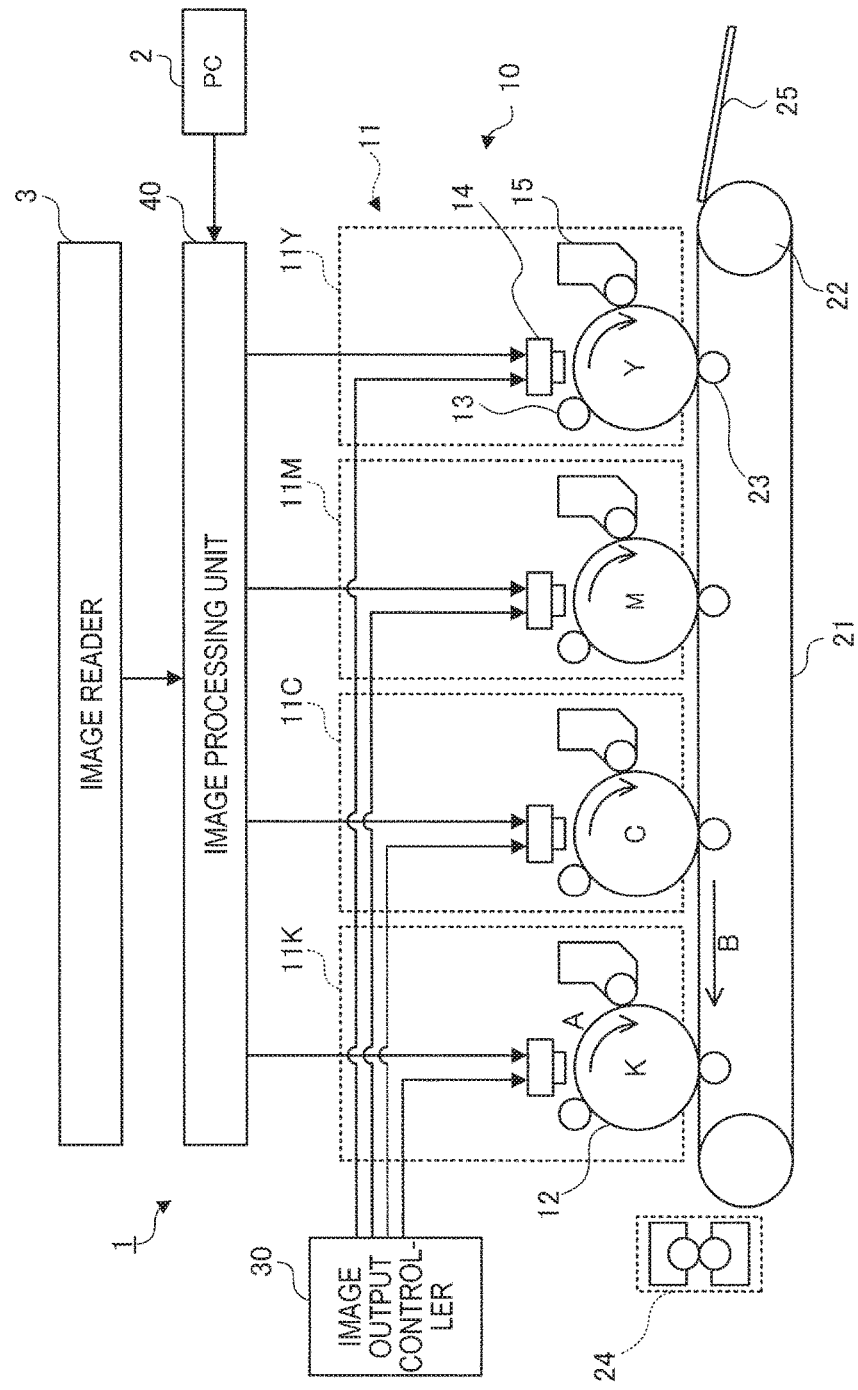
FIG. 1 is a view illustrating an example of an entire configuration of an image forming apparatus to which a first exemplary embodiment is applied.

FIG. 1 is a view illustrating an example of an entire configuration of an image forming apparatus 1 to which a first exemplary embodiment is applied. The image forming apparatus 1 illustrated in FIG. 1 is an image forming apparatus generally called a tandem type. The image forming apparatus 1 includes an image forming process unit 10 that forms images corresponding to image data for each color, an image output controller 30 that controls the image forming process unit 10, and an image processing unit 40 that is connected to, for example, a personal computer (PC) 2 or an image reader 3 and performs a predetermined image processing on image data received from the personal computer (PC) 2 or the image reader 3.

The image forming process unit 10 is provided with image forming units 11Y, 11M, 11C, and 11K (referred to as the image forming unit 11 if not distinguished) arranged in parallel at predetermined intervals. The image forming unit 11 includes a photoconductor drum 12 as an example of an image carrier that forms an electrostatic latent image and holds a toner image, a charging unit 13 as an example of a charging unit that charges the surface of the photoconductor drum 12 with a predetermined potential, a print head 14 that, exposes the photoconductor drum 12 charged by the charging unit 13, and a developing device 15 as an example of a developing unit that develops the electrostatic latent image obtained by the print head 14. The respective image forming units 11Y, 11K, 11C, and 11K form toner images of yellow (Y), magenta (M), cyan (C), and black (K), respectively.

In addition, in order to perform multiple transfer of the toner images having respective colors, which are formed on the photoconductor drums 12 of the respective image forming units 11Y, 11M, 11C, and 11K, to a recording sheet 25 as an example of a transfer target member, the image forming process unit 10 includes a sheet transport belt 21 that transports the recording sheet 25, a driving roller 22 that drives the sheet transport belt 21, transfer rollers 23 as an example of a transfer unit that transfer the toner images of the photoconductor drums 12 to the recording sheet 25, and a fixing machine 24 that fixes the toner images on the recording sheet. 25.

In the image forming apparatus 1, the image forming process unit 10 forms images based on various types of control signals supplied from the image output controller 30. Further, under the control of the image output controller 30, the image data received from the personal computer (PC) 2 or the image reader 3 are subjected to an image processing by the image processing unit 40, and then supplied to the image forming unit 11. Further, for example, in the image forming unit 11K of black (K), the photoconductor drum 12 is charged with a predetermined potential by the charging unit 13 while being rotated in a direction indicated by arrow A, and exposed by the print head 14 that emits light based on the image data supplied from the image processing unit 40. Therefore, an electrostatic latent image related to an image of black (K) is formed on the photoconductor drum 12. Further, the electrostatic latent image formed on the photoconductor drum 12 is developed by the developing device 15 such that the toner image of black (K) is formed on the photoconductor drum 12. The image forming units 11Y, 11M and 11C also form color toner images of yellow (Y), magenta Cd), and cyan (C), respectively.

The individual color toner images on the photoconductor drums 12, which are formed in the respective image forming units 11, are sequentially and electrostatically transferred, by a transfer electric field applied to the transfer rollers 23, to the recording sheet 25 supplied along with the movement of the sheet transport belt 21 that moves in a direction indicated by arrow B such that a synthesized toner image in which the individual color toner images are superimposed one on another is formed on the recording sheet 25.

Thereafter, the recording sheet 25 having the synthesized toner image electrostatically transferred thereto is transported to the fixing machine 24. The synthesized toner image on the recording sheet 25 transported to the fixing machine 24 is fixed on the recording sheet 25 by being subjected to a fixing processing by heat and pressure by the fixing machine 24, and the recording sheet 25 is discharged from the image forming apparatus 1.

(Print Head 14)

Figure 2:
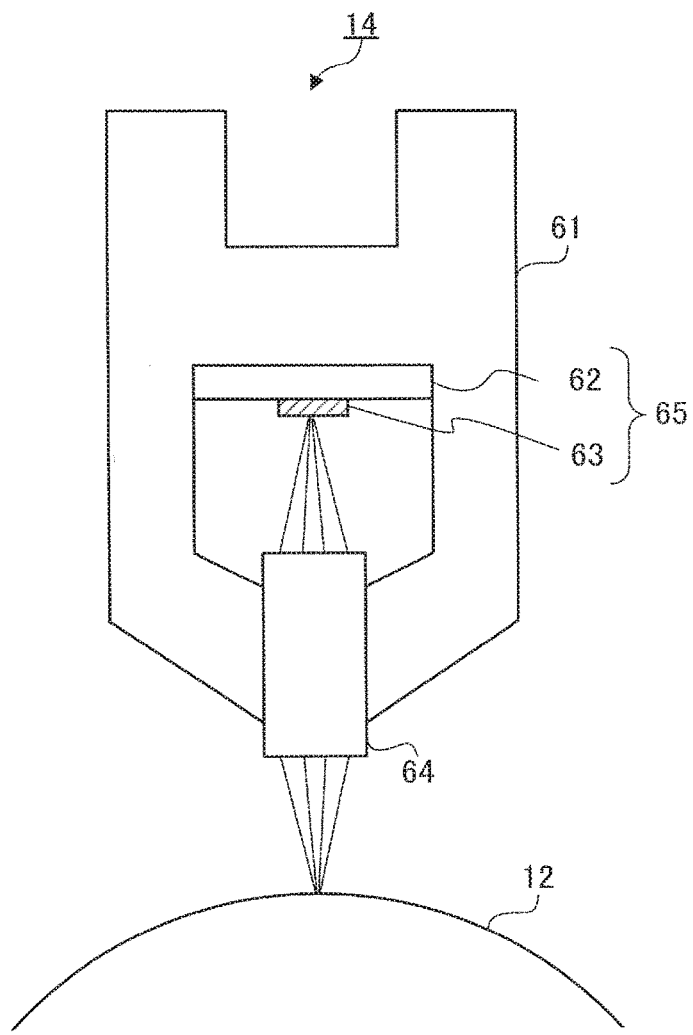
FIG. 2 is a cross-sectional view illustrating an example of a configuration of a print head.

FIG. 2 is a cross-sectional view illustrating an example of a configuration of the print head 14. The print head 14, as an example of an exposing unit, includes a housing 61, a light emitting device 65 as an example of a light emitting unit that includes a light source unit 63 provided with plural light emitting elements (in the first exemplary embodiment, light emitting diodes LED as an example of light emitting elements) that expose the photoconductor drum 12, and a rod lens array 64 as an example of an optical unit that forms an image on the surface of the photoconductor drum 12 by using light emitted from the light source unit 63.

The light emitting device 65 includes a circuit board 62 on which the above-described light source unit 63, a signal generating circuit 110 (see FIG. 3 to be described below) that drives the light source unit 63, and the like are mounted.

The housing 61 is formed of, for example, a metal, and supports the circuit board 62 and the rod lens array 64, and the housing 61 is set in such a manner that the light emitting surface of the light emitting element of the light source unit. 63 is a focal plane of the rod lens array 64, In addition, the rod lens array 64 is disposed in an axial direction of the photoconductor drum 12 (in a main scanning direction, in an X direction in FIGS. 3 and 4B to be described below).

(Light Emitting Device 65)

Figure 3:
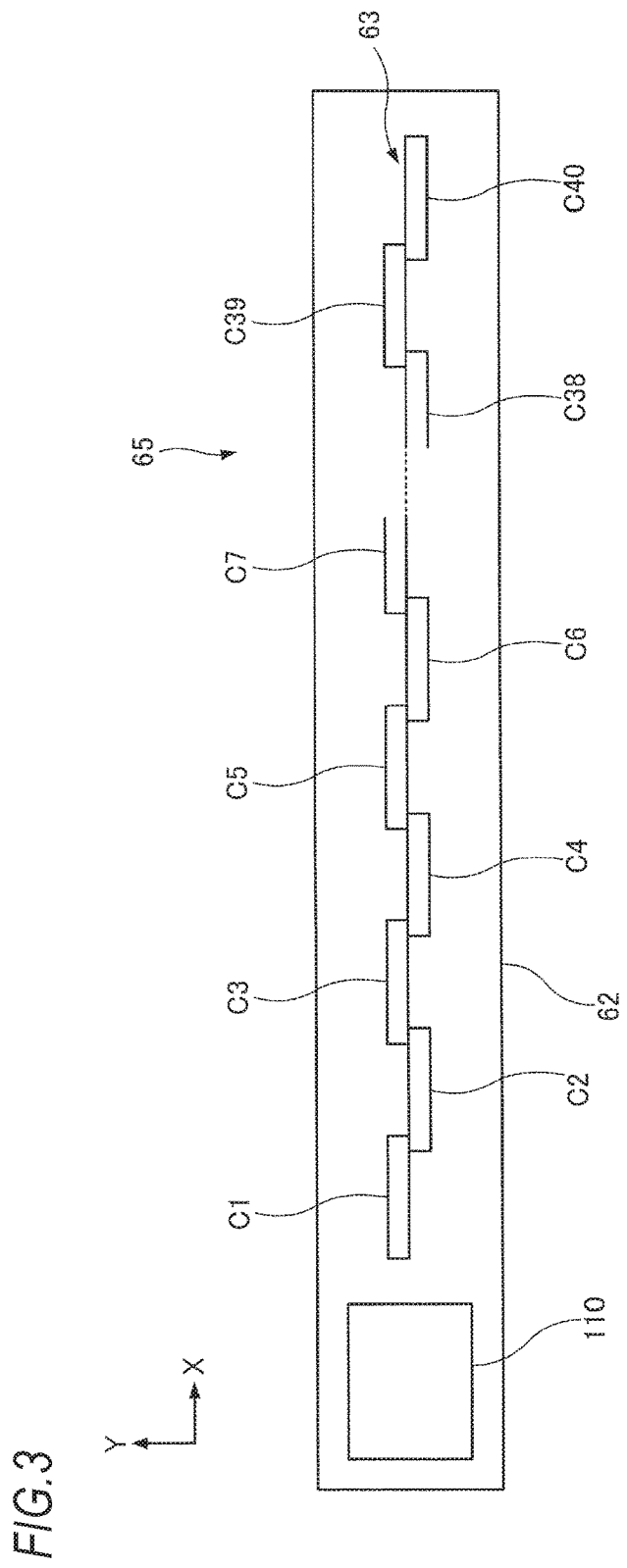
FIG. 3 is a top view of an example of a light emitting device.

FIG. 3 is a top view of an example of the light emitting device 65.

In the light emitting device 65 illustrated as an example in FIG. 3, the light source unit 63 is configured such that light emitting chips C1-C40 (referred to as a light emitting chip C if not distinguished) as an example of forty light emitting components are disposed in two rows in a staggered pattern on the circuit board 62 in the X direction, that is, the main scanning direction. The light emitting chips C1-C40 may have the same configuration.

In the specification, "-" indicates plural constituent elements that are distinguished by numbers, respectively, and means that the plural constituent elements include the constituent elements indicated by the numbers described before and after "-" and the constituent elements indicated by the numbers between the numbers of the constituent elements. For example, the light emitting chips C1-C40 include the light emitting chips from the light emitting chips C1 to the light emitting chip C40 in numerical order.

In the first exemplary embodiment, a total of 40 light emitting chips C are used. It should be noted that the number of light emitting chips C is not limited thereto.

The light emitting device 65 is equipped with the signal generating circuit 110 that drives the light source unit 63. The signal generating circuit 110 is configured with, for example, an integrated circuit (IC) and the like. Further, the light emitting device 65 may not be equipped with the signal generating circuit 110. In this case, the signal generating circuit 110 is provided outside the light emitting device 65, and supplies a control signal or the like for controlling the light emitting chip C through a cable. Here, it will be described that the light emitting device 65 is provided with the signal generating circuit 110.

The arrangement of the light emitting chips C will be described in detail below.

Figure 4A:
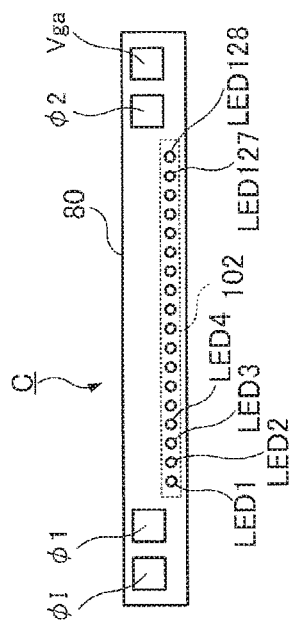
FIGS. 4A and 4B are views illustrating an example of a configuration of light emitting chips, a configuration of a signal generating circuit of the light emitting device, and a configuration of wiring (lines) on a circuit board.
Figure 4B:
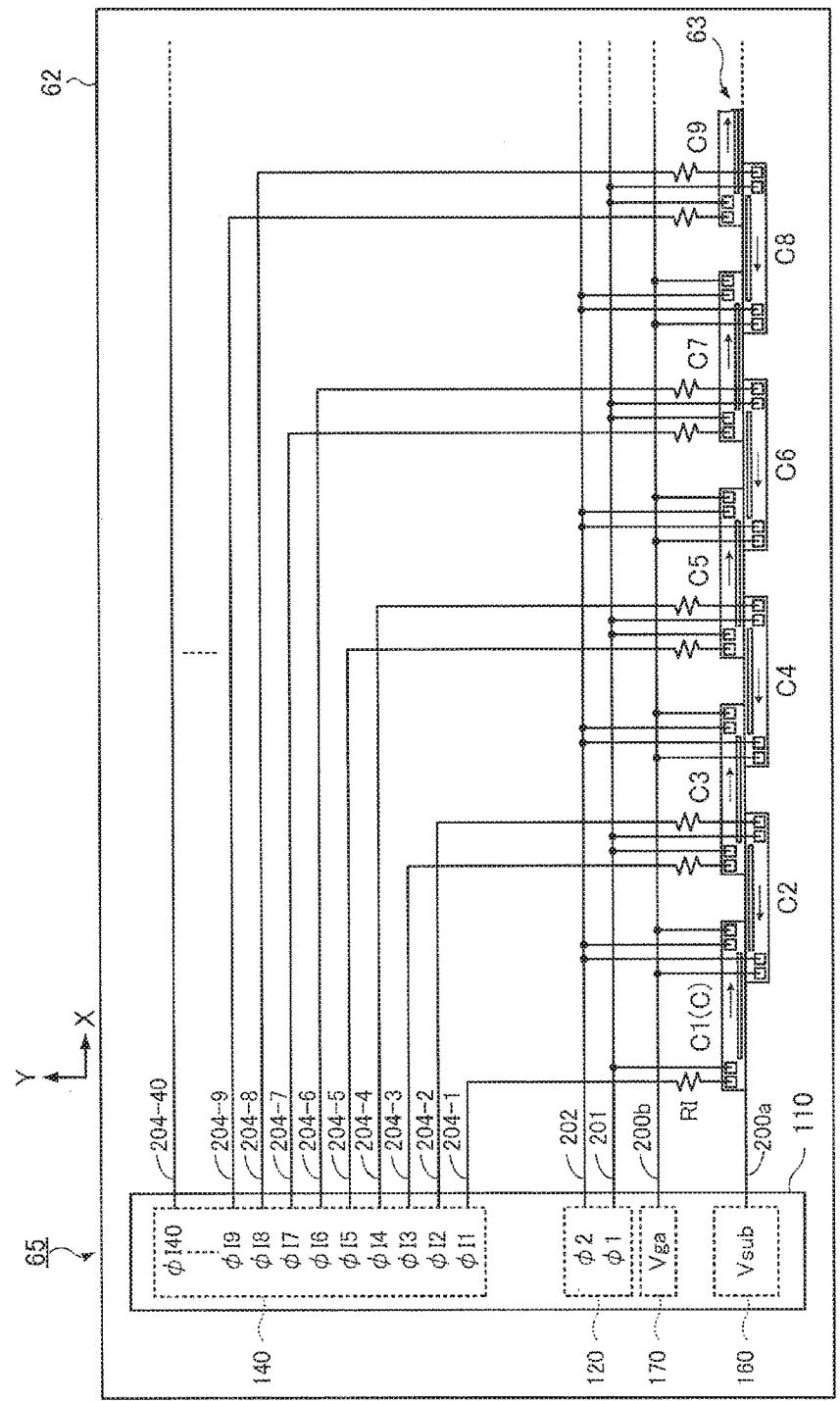

FIGS. 4A and 4B are views illustrating an example of a configuration of the light emitting chips, a configuration of the signal generating circuit 110 of the light emitting device 65, and a configuration of wiring (lines) on the circuit board 62. FIG. 4A illustrates the configuration of a light emitting chip C, and FIG. 4B illustrates the configuration of the signal generating circuit 110 of the light emitting device 65 and the configuration of the wiring (lines) on the circuit board 62. Further, FIG. 4B illustrates the part of the light emitting chips C1-C9 among the light emitting chips C1-C40.

First, the configuration of the light emitting chip C illustrated in FIG. 4A will be described.

Figure 6:
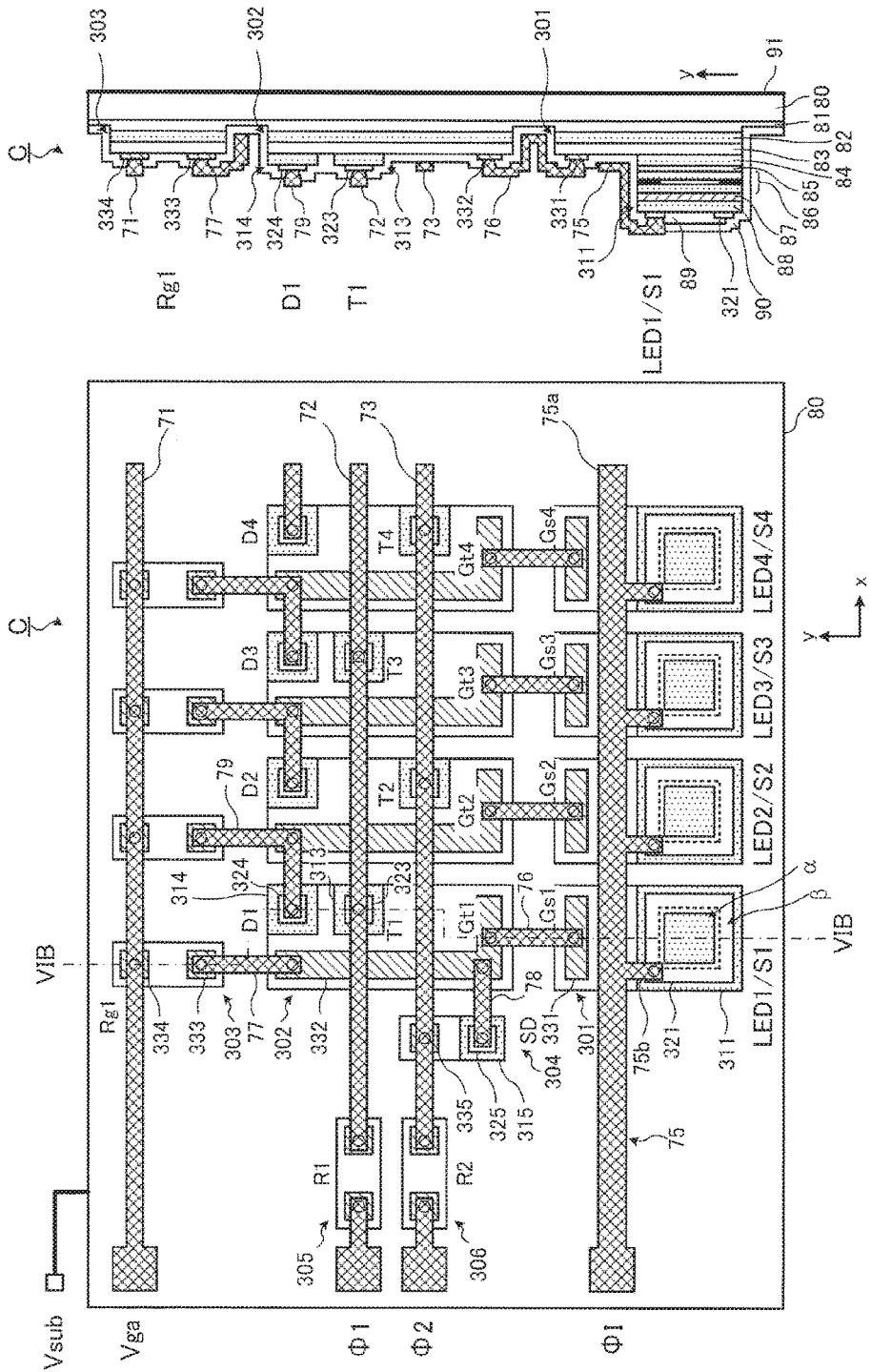

The light emitting chip C is provided with a light emitting unit 102 configured to include plural light emitting elements (in the first exemplary embodiment, light emitting diodes LED1-LED128 (referred to as a light emitting diode LED if not distinguished)) provided in a row shape along one long side in a rectangular surface of a substrate 80 adjacent to the one long side. Further, the light emitting chip C is provided with terminals (a. $\phi 1$ terminal, a $\phi 2$ terminal, a Vga terminal, and a $\phi I$ terminal) which are plural bonding pads for receiving various types of control signals or the like, at both end portions in the direction of the long side of the surface of the substrate 80. Further, these terminals are provided in the order of the $\phi I$ terminal and the $\phi 1$ terminal from one end portion of the substrate 80, and are provided in the order of the Vga terminal and the $\phi 2$ terminal from the other end portion of the substrate 80. Further, the light emitting unit 102 is provided between the $\phi 1$ terminal and the $\phi 2$ terminal. Further, as a Vsub terminal, a back electrode 91 (see FIGS. 6A and 6B to be described below) is provided on the back surface of the substrate 80.

The "row shape" is not limited to the case where the plural light emitting elements are disposed in a straight line as illustrated in FIG. 4A, and the respective light emitting elements of the plural light emitting elements may be disposed with different deviation amounts with respect to a direction orthogonal to the row direction. For example, assuming that the light emitting surface (a region 311 of the light emitting diode LED in FIGS. 6A and 6B to be described below) of the light emitting element is defined as a pixel, each of the light emitting elements may be disposed with a deviation amount of several pixels or several tens of pixels in the direction orthogonal to the row direction. In addition, neighboring light emitting elements may be alternately disposed, or the plural light emitting elements may be disposed one by one in a zigzag pattern.

Next, the configuration of the signal generating circuit 110 of the light emitting device 65 and the configuration of the wiring (lines) on the circuit board 62 will be described with reference to FIG. 4B.

As described above, the circuit board 62 of the light emitting device 65 is equipped with the signal generating circuit 110 and the light emitting chips C1-C40, and has the wiring (lines) which connects the signal generating circuit 110 and the light emitting chips C1-C40.

First, the configuration of the signal generating circuit 110 will be described.

Image data, which are subjected to image processing, and various types of control signals are input to the signal generating circuit 110 by the image output controller 30 and the image processing unit 40 (see FIG. 1). The signal generating circuit 110 rearranges the image data or corrects a light amount based on the image data and the various types of control signals.

The signal generating circuit 110 includes a transfer signal generating unit 120 that transmits a first transfer signal $\phi 1$ and a second transfer signal $\phi 2$ to the light emitting chips C1-C40 based on the various types of control signals.

The signal generating circuit 110 includes a lighting signal generating unit 140 that transmits lighting signals $\phi I1$-$\phi I40$ (referred to as a lighting signal $\phi I$ if not distinguished) to the light emitting chips C1-C40, respectively, based on the various types of control signals.

The signal generating circuit 110 includes a reference potential supply unit 160 that supplies a reference potential Vsub serving as a reference of potentials to the light emitting chips C1-C40, and a power source potential supply unit 170 that supplies power source potential Vga for driving the light emitting chips C1-C40.

Next, the arrangement of the light emitting chips C1-C40 will be described.

The odd-numbered light emitting chips C1, C3, C5, . . . are arranged in a row at an interval in the long side direction of the substrate 80. Likewise, the even-numbered light emitting chips C2, C4, C6, . . . are also arranged in a row at an interval in the long side direction of the substrate 80. Further, the odd-numbered light emitting chips C1, C3, C5, . . . and the even-numbered light emitting chips C2, C4, C6, . . . are arranged in a staggered pattern in a state of being rotated by 180° relative to each other so that the long sides thereof face each other at the sides of the light emitting units 102 provided on the light emitting chips C. Further, between the light emitting chips C, the positions of the light emitting elements are also set to be line at a predetermined interval in the main scanning direction (X direction). Further, arrows in the direction of the row of the light emitting elements (in the first exemplary embodiment, the light emitting diodes LED1-LED128 in numerical order) of the light emitting unit 102 illustrated in FIG. 4A are indicated on the light emitting chips C1-C40 in FIG. 4B.

The wiring (lines), which connects the signal generating circuit 110 and the light emitting chips C1-C40, will be described.

A power source line 200a is provided on the circuit board 62 to be connected to the back electrode 91 (see FIG. 6 to be described below) that is the Vsub terminal provided on the back surface of the substrate 80 of the light emitting chip C and to supply the reference potential Vsub.

A power source line 200b, is provided on the circuit board 62 to be connected to the Vga terminal provided on the light emitting chip C and to supply the power source potential Vga for driving.

On the circuit board 62, a first transfer signal line 201 is provided to transmit the first transfer signal $\phi 1$ to the $\phi 1$ terminals of the light emitting chips C1-C40 from the transfer signal generating unit 120 of the signal generating circuit 110, and a second transfer signal line 202 is provided to transmit the second transfer signal φ2 to the φ2 terminals of the light emitting chips C1-C40 is provided. The first transfer signal φ1 and the second transfer signal φ2 are transmitted in common (in parallel) to the light emitting chips C1-C40.

Lighting signal lines 204-1-204-40 (referred to as a lighting signal line 204 if not distinguished) are provided on the circuit board 62 to transmit the lighting signals φI1-φI40 through respective current limit resistances RI to the φI terminals of the respective light emitting chips C1-C40 from the lighting signal generating unit 140 of the signal generating circuit 110.

As described above, the reference potential Vsub and the power source potential Vga are supplied in common to all of the light emitting chips C1-C40 on the circuit board 62. The first transfer signal φ1 and the second transfer signal φ2 are also transmitted in common (in parallel) to the light emitting chips C1-C40. Meanwhile, the lighting signals φI1-φI40 are individually transmitted to the light emitting chips C1-C40, respectively.

(Light Emitting Chip C)

Figure 5:
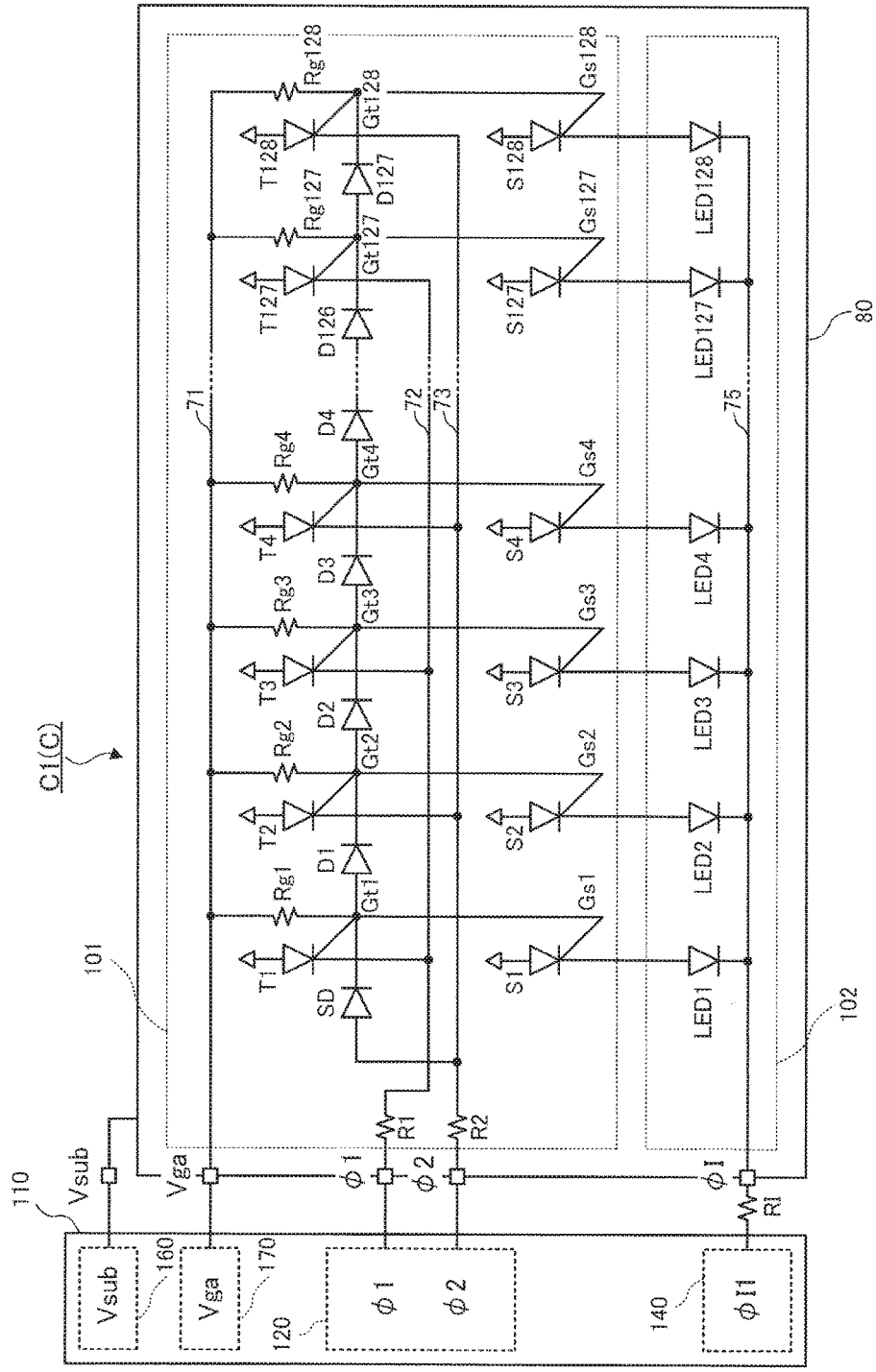
FIG. 5 is an equivalent circuit diagram for explaining a circuit configuration of the light emitting chip equipped with a self-scanning light-emitting device (SLED) array according to the first exemplary embodiment.

FIG. 5 is an equivalent circuit diagram for explaining a circuit configuration of the light emitting chip equipped with a self-scanning light-emitting device (SLED) array according to the first exemplary embodiment. The respective elements, which are described below, are disposed based on a layout (see FIGS. 6A and 6B to be described below) on the light emitting chip C, except for the terminals (the φ1 terminal, the φ2 terminal, the Vga terminal, and the φI terminal). Further, the positions of the terminals (the φ1 terminal, the φ2 terminal, the Vga terminal, and the φI terminal) are different from those of FIG. 4A, but illustrated at a left end in the drawing for explaining a connection relationship with the signal generating circuit 110. Further, the Vsub terminal provided on the back surface of the substrate 80 is illustrated in a state of being drawn out to the outside of the substrate 80.

Here, regarding the relationship with the signal generating circuit 110, the light emitting chip C will be described as an example of the light emitting chip C1. Accordingly, in FIG. 5, the light emitting chip C is indicated as the light emitting chip C1(C). The configurations of the other light emitting chips C2-C40 are similar to that of the light emitting chip C1.

The light emitting chip C1(C) is provided with the light emitting unit 102 (see FIG. 4A) including the light emitting diodes LED1-LED128.

The light emitting chip C1(C) is provided with setting thyristors S1-S128 (referred to as a setting thyristor S if not distinguished). Regarding the light emitting diodes LED1-LED128 and the setting thyristor S1-S128, the light emitting diodes LED and the setting thyristors S having the same numbers are connected in series, respectively.

As illustrated in FIG. 6B to be described below, the light emitting diodes LED are stacked on the setting thyristors S arranged in a row shape on the substrate 80. Therefore, the light emitting diodes LED1-LED128 are also arranged in a row shape.

The light emitting chip C1(C) is provided with transfer thyristors T1-T128 (referred to as a transfer thyristor T if not distinguished) arranged in a row shape in the same way as the light emitting diodes LED1-LED128 and the setting thyristors S1-S128.

The transfer thyristor T is described herein as an example of a transfer element, but other circuit elements may be used as long as the elements enter an ON state sequentially, and for example, a circuit element made by combining a shift register or plural transistors may be used.

In addition, the light emitting chip C1(C) is provided with coupling diodes D1-D127 (referred to as a coupling diode D if not distinguished) between a pair of transfer thyristors in a case where two transfer thyristors, among the transfer thyristors T1-T128, are defined as the pair of transfer thyristors in numerical order.

The light emitting chip C1(C) is provided with power source line resistances Rg1-Rg128 (referred to as a power source line resistance Rg if not distinguished).

The light emitting chip C1(C) is provided with one start diode SD. Further, current limit resistances R1 and R2 are provided in order to prevent excessive current from flowing into a first transfer signal line 72 through which the first transfer signal φ1 to be described below is transmitted, and a second transfer signal line 73, through which the second transfer signal φ2 is transmitted.

Here, a transfer unit 101 is configured with the setting thyristors S1-S128, the transfer thyristors T1-T128, the power source line resistances Rg1-Rg128, the coupling diodes D1-D127, the start diode SD, and the current limit resistances R1 and R2.

The light emitting diodes LED1-LED128 of the light emitting unit 102 and the setting thyristors S1-S128 and the transfer thyristors T1-T128 of the transfer unit 101 are arranged in numerical order from the left side in FIG. 5. Further, the coupling diodes D1-D127 and the power source line resistances Rg1-Rg128 are also arranged in numerical order from the left side in the drawing.

Further, the transfer unit 101 and the light emitting unit 102 are arranged in the order from the top in FIG. 5.

In the first exemplary embodiment, the number of light emitting diodes LED of the light emitting unit 102 is 128, and each of the number of setting thyristors S of the transfer unit 101, the number of transfer thyristors T of the transfer unit 101, and the number of power source line resistances Rg of the transfer unit 101 is 128. Further, the number of coupling diodes D is 127 which is less by one than the number of transfer thyristors T.

The number of light emitting diodes LED or the like is not limited to the aforementioned number, and may be the predetermined number. Further, the number of transfer thyristors T may be more than the number of light emitting diodes LED.

The light emitting diode LED is a two-terminal semiconductor element provided with an anode terminal (anode) and a cathode terminal (cathode), the thyristor (the setting thyristor S or the transfer thyristor T) is a three-terminal semiconductor element provided with an anode terminal (anode), a gate terminal (gate), and a cathode terminal (cathode), and the coupling diode D1 and the start diode SD are a two-terminal semiconductor element provided with an anode terminal (anode) and a cathode terminal (cathode).

As described below, the light emitting diode LED, the thyristor (the setting thyristor S or the transfer thyristor T), the coupling diode D1, and the start diode SD sometimes are not necessarily provided with the anode terminal, the gate terminal, and the cathode terminal, which are configured as an electrode. Therefore, hereinafter, terminals may be abbreviated and indicated within parentheses in some cases.

Next, an electrical connection between the respective elements in the light emitting chip C1 (C) will be described.

The anode of each of the transfer thyristor T and the setting thyristor S is connected to the substrate 80 of the light emitting chip C1 (C) (anode common).

In addition, the anode is connected to the power source line 200a (see FIG. 4B) through the back electrode 91 (see FIG. 6B to be described below) which is the Vsub terminal provided on the back surface of the substrate 80. The power source line 200a is supplied with the reference potential Vsub from the reference potential supply unit 160.

This connection is a configuration in a case where a p-type substrate 80 is used. In a case where an n-type substrate is used, the polarity is reversed, and in a case where an intrinsic (i) type substrate with no added impurity is used, a terminal is provided at a side where the transfer unit 101 and the light emitting unit 102 are provided on the substrate, to be connected to the power source line 200a that supplies the reference potential Vsub.

The cathodes of the odd-numbered transfer thyristors T1, T3, . . . are connected to the first transfer signal line 72 along the arrangement of the transfer thyristors T. Further, the first transfer signal line 72 is connected to the ϕ1 terminal through the current limit resistance R1. The first transfer signal line 201 (see FIG. 4B) is connected to the ϕ1 terminal, and the first transfer signal ϕ1 is transmitted from the transfer signal generating unit 120.

Meanwhile, the cathodes of the even-numbered transfer thyristors T2, T4, . . . are connected to the second transfer signal line 73 along the arrangement of the transfer thyristors T. Further, the second transfer signal line 73 is connected to the ϕ2 terminal through the current limit resistance R2. The second transfer signal line 202 (see FIG. 4B) is connected to the ϕ2 terminal, and the second transfer signal ϕ2 is transmitted from the transfer signal generating unit 120.

The cathodes of the light emitting diodes LED1-LED128 are connected to a lighting signal line 75. The lighting signal line 75 is connected to the ϕI terminal. In the light emitting chip C1, the ϕI terminal is connected to the lighting signal line 204-1 through the current limit resistance RI provided outside the light emitting chip C1 (C), and the lighting ϕI1 is transmitted from the lighting signal generating unit 140 (see FIG. 4B). The lighting signal ϕI1 supplies a current for turning on the light emitting diodes LED1-LED128. Further, the lighting signal lines 204-2-204-40 are connected to the ϕI terminals of the other light emitting chips C2-C40, respectively, through the current limit resistance RI, and the lighting signals ϕI2-ϕI40 are transmitted from the lighting signal generating unit 140 (see FIG. 4B).

Respective gates Gt1-Gt128 (referred to as a gate Gt if not distinguished) of the transfer thyristors T1-T128 are connected, in a one-to-one correspondence manner, to gates Gs1-Gs128 (referred to as a gate Gs if not distinguished) of the setting diodes S1-S128 indicated by the same numbers. Therefore, among the gates Gt1-Gt128 and the gates Gs1-Gs128, the gates indicated by the same numbers have electrically the same potential. Therefore, for example, the gate Gt1 (gate Gs1) is used to express that the gate Gt1 and the gate Gs1 have the same potential.

Each of the coupling diodes D1-D127 is connected between gates Pt of each pair where the gates Gt1-Gt128 of the transfer thyristors T1-T128 are paired two by two in numerical order. That is, the coupling diodes D1-D127 are connected in series such that each of the coupling diodes D1-127 is interposed between two adjacent gates of the gates Gt1-Gt128. Further, a direction of the coupling diode D1 is connected in a direction in which a current flows from, the gate Gt1 to the gate Gt2. The same applies to the other coupling diodes D2-D127.

The gate Gt (gate Gs) of the transfer thyristor T is connected to a power source line 71 through the power source line resistance Rg provided to correspond to each of the transfer thyristors T. The power source line 71 is connected to the Vga terminal. The power source line 200b (see FIG. 4B) is connected to the Vga terminal, and is supplied with the power source potential Vga from the power source potential supply unit 170.

The gate Gt1 of the transfer thyristor T1 is connected to the cathode terminal of the start diode SD. Meanwhile, the anode of the start diode SD is connected to the second transfer signal line 73.

FIGS. 6A and 6B are views illustrating an example of top plan layout view and a cross-sectional view of the light emitting chip C according to the first exemplary embodiment, respectively. FIG. 6A is a top plan layout view of the light emitting chip C, and FIG. 6B is a cross-sectional view taken along line VIB-VIB in FIG. 6A. Here, because a connection relationship between the light emitting chip C and the signal generating circuit 110 is not illustrated, it is not necessary to describe the light emitting chip C1 as an example. Therefore, the light emitting chip is indicated as light emitting chip C.

FIG. 6A illustrates a portion which is focused on the light emitting diodes LED1-LED4, the setting thyristors S1-S4, and the transfer thyristors T1-T4. Further, the positions of the terminals (the ϕ1 terminal, the ϕ2 terminal, the Vga terminal, and the ϕI terminal) are different from those in FIG. 4A, but the terminals are illustrated at the left end portion in the drawing for convenience of description. Further, the Vsub terminal (back electrode 91) provided on the back surface of the substrate 80 is illustrated in a state of drawn out to the outside of the substrate 80. When the terminals are provided to correspond to FIG. 4A, the ϕ2 terminal, the ϕI terminal, and the current limit resistance R2 are provided at the right end portion of the substrate 80. In addition, the start diode SD may be provided at the right end portion of the substrate 80.

In FIG. 6B, which is a cross-sectional view taken along line VIP-VIB in FIG. 6A, the light emitting diode LED1/the setting thyristor S1, the transfer thyristor T1, the coupling diode D1, and the power source line resistance Rg1 are illustrated from the lower side in the drawing. Further, the light emitting diode LED1 and the setting thyristor S1 are stacked.

In FIGS. 6A and. 6B, main elements or terminals are indicated by names.

First, a cross-sectional structure of the light emitting chip C will be described with reference to FIG. 6B.

A p-type anode layer 81 (p anode layer 81), an n-type gate layer 82 (n gate layer 82), a p-type gate layer 83 (p gate layer 83), and an n-type cathode layer 84 (n cathode layer 84) are sequentially provided on the substrate 80 (substrate 80). Further, hereinafter, the terms indicated within parentheses will be used. The same applies to the other cases.

A tunnel junction (tunnel diode) layer 85 is provided on the n cathode layer 84.

In addition, a p-type anode layer 86 (p anode layer 86), a light emitting layer 87, and an n-type cathode layer 88 (n cathode layer 88) are provided on the tunnel junction layer 85.

A light emission port protective layer 89, which is formed of an insulating material which is transparent with respect to light emitted by the light emitting diode LED, provided on the light emitting diode LED1.

As illustrated in FIG. 6B, a protective layer 90, which is formed of a transparent insulating material and provided to cover a surface and a lateral surface of an island thereof, is provided on the light emitting chip C. Further, the wiring such as the power source line 71, the first transfer signal line 72, the second transfer signal line 73, and the lighting signal line 75 is connected to the island through a through hole (indicated by O in FIG. 6A) provided in the protective layer 90. In the following description, the descriptions of the protective layer 90 and the through hole will be omitted.

As illustrated in FIG. 6B, the back electrode 91, which is the Vsub terminal, is provided on the back surface of the substrate 80.

The p anode layer 81, the n gate layer 82, the p gate layer 83, the n cathode layer 84, the tunnel junction layer 85, the p anode layer 86, the light emitting layer 87, and the n cathode layer 88 are semiconductor layers, respectively, and sequentially stacked by an epitaxial growth. Further, to form plural islands (islands 301, 302, 303, . . . to be described below) separated from each other, semiconductor layers between the islands are removed by etching (mesa etching). Further, the p anode layer 81 may be or not be separated. In FIG. 6B, the p anode layer 81 is partially separated in the thickness direction. In addition, the p anode layer 81 may also serve as the substrate 80.

The setting thyristor S, the transfer thyristor T, the coupling diode D, the power source line resistance Rg, and the like (in FIG. 6B, the setting thyristor S1, the transfer thyristor T1, the coupling diode D1, and the power source line resistance Rg1) are configured by using the p anode layer 81, the n gate layer 82, the p gate layer 83, and the n cathode layer 84.

Here, the indications of the p anode layer 81, the n gate layer 82, the p gate layer 83, and the n cathode layer 84 are made to correspond to functions (operations) in a case where the setting thyristor S and the transfer thyristor T are configured. That is, the p anode layer 81 operates as an anode, the n gate layer 82 and the p gate layer 83 operate as gates, and the n cathode layer 84 operates as a cathode. In a case where the coupling diode D and the power source line resistance Rg are configured, different functions (operations) are performed as described below.

The light emitting diode LED (in FIG. 6B, the light emitting diode LED1) is configured with the p anode layer 86, the light emitting layer 87, and the n cathode layer 88.

The indications of the p anode layer 86 and the n cathode layer 88 are also similarly made to correspond to functions (operations) in the case where the light emitting diode LED is configured. That is, the p anode layer 86 operates as an anode, and the n cathode layer 88 operates as a cathode.

As described below, the plural islands include an island that does not, include some layers of the plural layers of the p anode layer 81, the n gate layer 82, the p gate layer 83, the n cathode layer 84, the tunnel junction layer 85, the p anode layer 86, the light emitting layer 87, and the n cathode layer 88. For example, the island 302 does not include a part of the tunnel junction layer 85 or the entire tunnel junction layer 85, the p anode layer 86, the light emitting layer 87, and the n cathode layer 88.

The plural islands include an island which does not include apart of a layer. For example, the island 302 includes the p anode layer 81, the n gate layer 82, the p gate layer 83, and the n cathode layer 84, but includes only a part of the n cathode layer 84.

Next, a plane layout of the light emitting chip C will be described with reference to FIG. 6A.

The setting thyristor S1 and the light emitting diode LED1 are provided in the island 301. The transfer thyristor T1 and the coupling diode D1 are provided in the island 302. The power source line resistance Rg1 is provided in the island 303. The start diode SD is provided in the island 304. The current limit resistance R1 is provided in the island 305, and the current limit resistance R2 is provided in the island 306.

Plural islands, which are similar to the islands 301, 302, and 303, are formed in parallel on the light emitting chip The setting thyristors S2, S3, S4, . . . , the light emitting diodes LED2, LED3, LED4, . . . , the transfer thyristors T2, T3, T4, . . . , the coupling diodes D2, D3, D4, . . . , and the like are provided in these islands as in the island 301, 302, and 303.

Here, the islands 301-306 are described in detail with reference to FIGS. 6A and 6B.

As illustrated in FIG. 6A, the setting thyristor S1 and the light emitting diode LED1 are provided in the island 301.

The setting thyristor S1 includes the p anode layer 81, the n gate layer 82, the p gate layer 83, and the n cathode layer 84. Further, a p-type ohmic electrode 331 (p ohmic electrode 331), which is provided on the p gate layer 83 exposed by removing the n cathode layer 88, the light emitting layer 87, the p anode layer 86, the tunnel junction layer 85, and the n cathode layer 84, is formed as an electrode (which may be indicated as a gate terminal Gs1 in some cases) of the to Gs1.

Meanwhile, the light emitting diode LED1 includes the p anode layer 86, the light emitting layer 67, and then cathode layer 88. The light emitting diode LED1 is stacked on the n cathode layer 84 of the setting thyristor S1 through the tunnel junction layer 85. Further, an n-type ohmic electrode 321 (n ohmic electrode 321), which is provided on the n cathode layer 88 (region 311), is formed as a cathode electrode.

In addition, a current confining layer 86b (see FIG. 7 to be described below) is included in the p anode layer 86. The current confining layer 86b is provided to confine a current, which flows in the light emitting diode LED, to a central portion of the light emitting diode LED. That is, a peripheral portion of the light emitting diode LED has many defects caused by the mesa etching. For this reason, non-light-emitting recombination is likely to occur. Accordingly, the current confining layer 86b is provided such that the central portion of the light emitting diode LED is a current passing part α in which the current easily flows, and the peripheral portion thereof is a current blocking part β in which the current hardly flows. As illustrated in the light emitting diode LED1 in FIG. 6A, an inner side of the broken line is the current passing part α, and an outer side of the broken line is the current blocking part β.

To extract light from the central portion of the light emitting diode LED1, the n ohmic electrode 321 is provided on the peripheral portion on the light emitting diode LED1 so that the n ohmic electrode 321 is opened at a central portion thereof.

The current confining layer 86b will be described below.

As the current confining layer 86b is provided, power consumed by the non-light-emitting recombination is suppressed, and as a result, the power consumption is reduced, and light extraction efficiency is improved. Further, the light extraction efficiency is a light amount that may be extracted per power.

The transfer thyristor T1 and the coupling diode D1 are provided in the island 302.

The transfer thyristor T1 includes the p anode layer 81, the n gate layer 82, the p gate layer 83, and the n cathode layer 84. That is, an n ohmic electrode 323, which is provided on the n cathode layer 84 (region 313) or an $n^{++}$ layer 85a of the tunnel junction layer 85 that is exposed by removing the n cathode layer 88, the light emitting layer 87, the p anode layer 86, and the tunnel junction layer 85, is formed as a cathode terminal. Further, the n ohmic electrode 323 may be provided on the n$^{++}$ layer 85a of the tunnel junction layer 85 without removing the n$^{++}$ layer 85a of the tunnel junction layer 85. Further, a p ohmic electrode 332, which is provided on the p gate layer 83 exposed by removing the n cathode layer 84, is formed as a terminal of the gate Gt1 (which may be indicated as a gate terminal Gt1 in some cases).

Likewise, the coupling diode D1 provided in the island 302 includes the p gate layer 83 and the n cathode layer 84. That is, an n ohmic electrode 324, which is provided on the n cathode layer 84 (region 314) exposed by removing some or all of the n cathode layer 88, the light emitting layer 87, the p anode layer 86, and the tunnel junction layer 85, is formed as a cathode terminal. Further, the n ohmic electrode 324 maybe provided on the n$^{++}$ layer 85a of the tunnel junction layer 85 without removing the n$^{++}$ layer 85a of the tunnel junction layer 85. Further, the p ohmic electrode 332, which is provided on the p gate layer 83 exposed by removing the n cathode layer 84, is formed as an anode terminal. Here, the anode terminal of the coupling diode D1 is similar to the gate Gt1 (gate terminal Gt1).

The power source line resistance Rg1 provided in the island 303 includes the p gate layer 83. Here, the p gate layer 83 is provided, as a resistance, between a p ohmic electrode 333 and a p ohmic electrode 334 which are provided on the p gate layer 83 exposed by removing the n cathode layer 88, the light emitting layer 87, the p anode layer 86, the tunnel junction layer 85, and the n cathode layer 84.

The start diode SD provided in the island 304 includes the p gate layer 83 and the n cathode layer 84. That is, an n ohmic electrode 325, which is provided on the n cathode layer 84 (region 315) exposed by removing the n cathode layer 88, the light emitting layer 87, the p anode layer 86, and the tunnel junction layer 85, is formed as a cathode terminal. Further, the n ohmic electrode 325 may be provided on the n$^{++}$ layer 85a of the tunnel junction layer 85 without removing the n$^{++}$ layer 85a of the tunnel junction layer 85. Further, a p ohmic electrode 335, which is provided on the p gate layer 83 exposed by removing the n cathode layer 84, is formed as an anode terminal.

The current limit resistance R1 provided in the island 305 and the current limit resistance R2 provided in the island 306 are provided to be similar to the power source line resistance Rg1 provided in the island 303, and use the p gate layers 83 between the two p ohmic electrodes (not designated by a reference numeral), as resistances, respectively.

A connection relationship between the respective elements will be described with reference to FIG. 6A.

The lighting signal line 75 has a stem portion 75a and plural branch portions 75b. The stem portion 75a is provided to extend in the row direction of the light emitting diodes LED. The branch portion 75b branches off from the stem portion 75a, and is connected to the n ohmic electrode 321 which is the cathode terminal of the light:emitting diode LED1 provided in the island 301. The same applies to the cathode terminals of the other light emitting diodes LED.

The lighting signal line 75 is connected to the ϕI terminal provided at a side of the light emitting diode LED1.

The first transfer signal line 72 is connected to the n ohmic electrode 323 which is the cathode terminal of the transfer thyristor T1 provided in the island 302. The cathode terminals of the other odd-numbered transfer thyristors T, which are provided in the islands similar to the island 302, are connected to the first transfer signal line 72. The first transfer signal line 72 is connected to the ϕ1 terminal through the current limit resistance R1 provided in the island 305.

Meanwhile, the second transfer signal line 73 is connected to the n ohmic electrode (not designated by reference numeral) which is the cathode terminal of the even-numbered transfer thyristor T provided in the island which is not designated by reference numeral. The second transfer signal line 73 is connected to the ϕ2 terminal through the current limit resistance R2 provided in the island 306.

The power source line 71 is connected to the p ohmic electrode 334 which is one terminal of the power source line resistance Rg1 provided in the island 303. One terminal of another power source line resistance Rg is also connected to the power source line 71. The power source line 71 is connected to the Vga terminal.

The p ohmic electrode 331 (gate terminal Gs1) of the light emitting diode LED1 provided in the island 301 is connected to the p ohmic electrode 332 (gate terminal Gt1) of the island 302 through connecting wiring 76.

The p ohmic electrode 332 (gate terminal Gt1) is connected to the p ohmic electrode 333 (the other terminal of the power source line resistance Rg1) of the island 303 through connecting wiring 77.

The n ohmic electrode 324 (the cathode terminal of the coupling diode D1) provided in the island 302 is connected to the p-type ohmic electrode (not designated by reference numeral), which is the gate terminal Gt2 of the adjacent transfer thyristor T2, through connecting wiring 79.

Although the descriptions are omitted herein, the same applies to the other light emitting diodes LED, setting thyristors S, transfer thyristors I, coupling diodes D, and the like.

The p ohmic electrode 332 (gate terminal Gt1) of the island 302 is connected to the n ohmic electrode 325 (the cathode terminal of the start diode SD), which is provided in the island 304, through connecting wiring 78. The p ohmic electrode 335 (the anode terminal of the start diode SD) is connected to the second transfer signal line 73.

Further, the above-described connection and configuration are made in a case where the p-type substrate 80 is used. In a case where the n-type substrate is used, the polarity is reversed. In addition, in a case where an i-type substrate is used, a terminal, which is connected to the power source line 200a that supplies the reference potential Vsub, is provided at a side where the transfer unit 101 and the light emitting unit 102 of the substrate are provided. Further, the connection and the configuration are similar to those of any one of the case where the p-type substrate is used and the case where the n-type substrate is used.

(Stack Structure of Setting Thyristor S and Light Emitting Diode LED)

Figure 7:
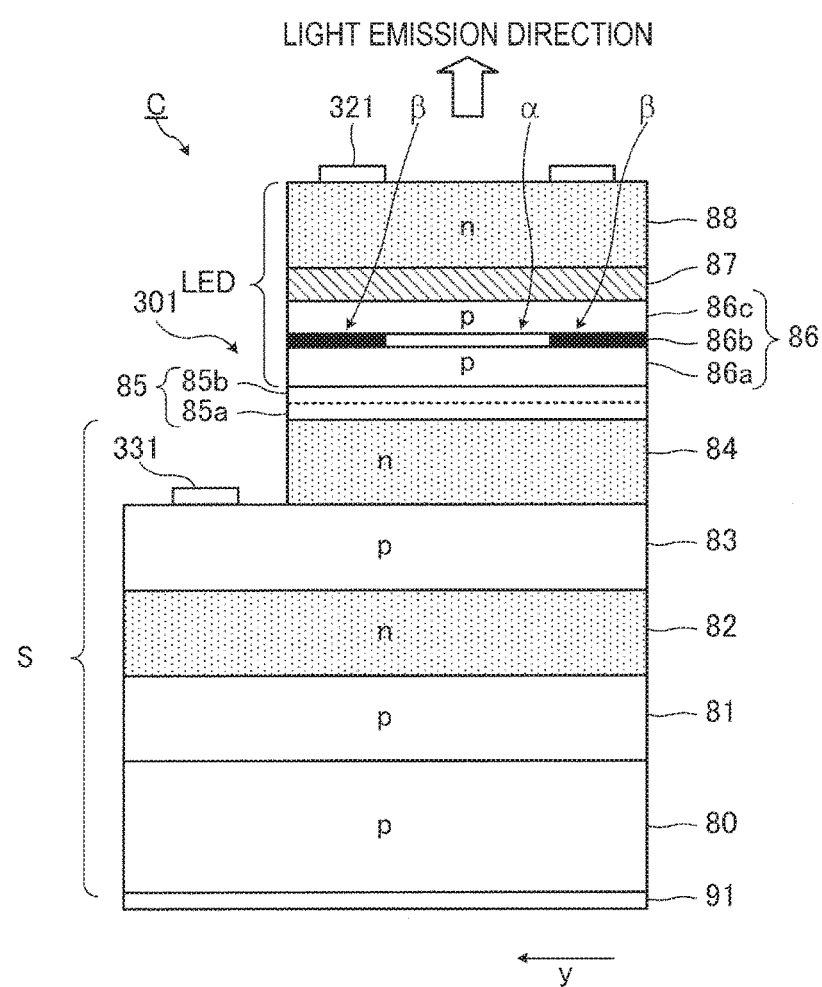
FIG. 7 is an enlarged cross-sectional view of an island in which a setting thyristor and the light emitting diode are stacked.

FIG. 7 is an enlarged cross-sectional view of the island 301 in which the setting thyristor S and the light emitting diode LED are stacked. Further, the light emission port protective layer 89 and the protective layer 90 are omitted. The same applies to the following description.

As described above, the light emitting diode LED is stacked on the setting thyristor S through the tunnel junction layer 85. That is, the setting thyristor S and the light emitting diode LED are connected in series.

The setting thyristor S includes the p anode layer 81, the n gate layer 82, the p gate layer 83, and the n cathode layer 84. That is, setting thyristor S has a 4-layer structure of pnpn.

The tunnel junction layer 85 includes the n$^{++}$ layer 85a formed by adding (doping) an n-type impurity (dopant) with high concentration, and a p$^{++}$ layer 85b formed by adding a p-type impurity with high concentration.

The light emitting diode LED includes the p anode layer 86, the light emitting layer 87, and the n cathode layer 88. Further, the light emitting layer 87 is a quantum well structure in which a well layer and a barrier layer are alternately stacked. In addition, the light emitting layer 87 maybe an intrinsic (i) layer to which no impurity is added. In addition, the light emitting layer 87 may be a structure other than the quantum well structure, and for example, the light emitting layer 87 may be a quantum line (quantum wire) or a quantum box (quantum dot).

The p anode layer 86 includes a lower p layer 86a, the current confining layer 86b, and an upper p layer 86c which are stacked. The current confining layer 86b includes the current passing part α and the current blocking part β. As illustrated in FIG. 6A, the current passing part α is provided in the central portion of the light emitting diode LED, and the current blocking part β is provided in the peripheral portion of the light emitting diode LED.

<Tunnel Junction Layer 85>

Figure 8A:
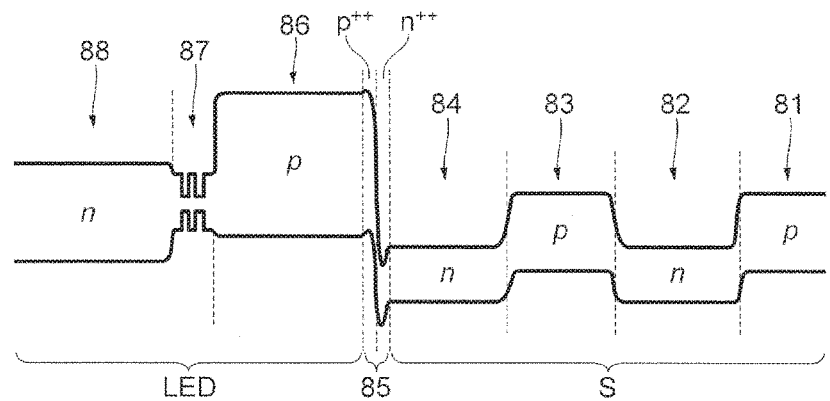
Figure 8B:
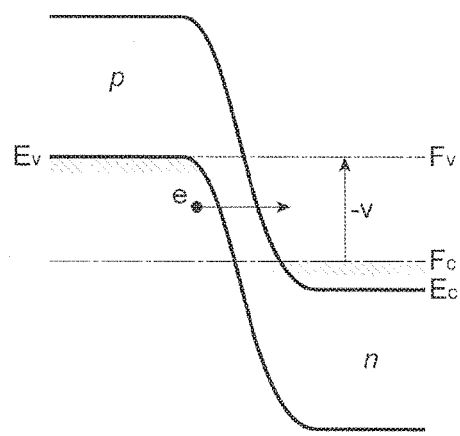
Figure 8C:
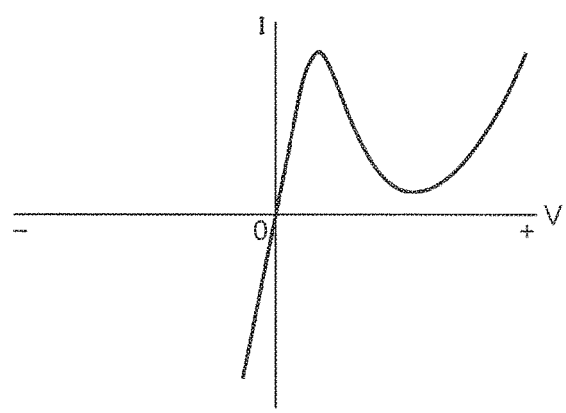

FIGS. 8A to 8C are views for further explaining the stack structure of the setting thyristor S and the light emitting diode LED. FIG. 8A is a schematic energy band diagram in the stack structure of the setting thyristor S and the light emitting diode LED, FIG. 8B is an energy band diagram of the tunnel junction layer 85 being in a reverse bias state, and FIG. 8c illustrates current and voltage characteristics of the tunnel junction layer 85.

As illustrated in the energy band diagram in FIG. 8A, when a voltage is applied such that the light emitting diode LED and the setting thyristor S are forward biased between the n ohmic electrode 321 and the back electrode 91 in FIG. 7, reverse bias occurs between the n$^{++}$ layer 85a and the p$^{++}$ layer 85b of the tunnel junction layer 85.

The tunnel junction layer 85 (tunnel junction) is a junction between the n$^{++}$ layer 85a formed by adding the n-type impurity with high concentration and the p$^{++}$ layer 85b formed by adding the p-type impurity with high concentration. For this reason, when a width of a depletion region is narrow and the forward bias occurs, an electron tunnels from a conduction band at a side of the n$^{++}$ layer 85a to a valence hand at a side of the p$^{++}$ layer 85b. In this case, a negative resistance characteristic appears.

Meanwhile, as illustrated in FIG. 8B, when the tunnel junction layer 85 (tunnel junction) is reverse biased (−V), the potential Ev of the valence band at the side of the p$^{++}$ layer 85b is higher than the potential Ec of the conduction band at the side of the n$^{++}$ layer 85a. Further, the electron tunnels from the valence band of the p$^{++}$ layer 85b to the conduction band at the side of the n$^{++}$ layer 85a. Further, as the reverse bias voltage (−V) increases, the electron easily tunnels. That is, as illustrated in FIG. 8C, the current easily flows in the tunnel junction layer 85 (tunnel junction) at the reverse bias.

Therefore, as illustrated in FIG. 8A, when the setting thyristor S is turned ON, the current flows between the setting thyristor S and the light emitting diode LED even though the tunnel junction layer 85 is reverse biased. Therefore, the light emitting diode LED emits light (is turned ON).

Here, when the connected transfer thyristor T is turned ON to be in an ON state, the setting thyristor S is brought into a state where the setting thyristor S is capable of changing to the ON state. Further, when the lighting signal φI is "Lo", the setting thyristor S is turned ON and thus is brought into the ON state, and turns on the light emitting diode LED (lighting is set). Therefore, the indication, "setting thyristor," is used herein.

<Thyristor>

Next, the basic operations of the thyristor (the transfer thyristor I and the setting thyristor S) will be described. As illustrated above, a thyristor is a semiconductor element having three terminals of an anode terminal (anode), a cathode terminal (cathode), and a gate terminal (gate). For example, the thyristor is configured so that the p-type semiconductor layer (the p anode layer 81 or the p gate layer 83) and the n-type semiconductor layer (the n gate layer 82 or the n cathode layer 84), which are formed of GaAs, GaAlAs, and AlAs, are stacked on the substrate 80. That is, the thyristor has a pnpn structure. Here, descriptions will be made assuming that a forward potential (diffusion potential) Vd of the pn junction configured with the p-type semiconductor layer and the n-type semiconductor layer is 1.5 V, as an example.

Hereinafter, descriptions will be made assuming that the reference potential Vsub supplied to the back electrode 91 (see FIG. 5 and FIGS. 6A and 6B) that is the Vsub terminal, is 0 V as a high-level potential (hereinafter, indicated as "H") and the power source potential Vga supplied to the Vga terminal is −3.3 V as a low-level potential (hereinafter, indicated as "L"), as an example.

The anode of the thyristor has the reference potential Vsub ("H" (0 V)) supplied to the back electrode 91.

When a potential (a negative potential having a large absolute value) lower than a threshold voltage is applied to the cathode, the thyristor, which is in the OFF state where the current does not flow between the anode and the cathode, changes to the ON state (turned. ON). Here, the threshold voltage of the thyristor has a value made by subtracting' the forward potential Vd (1.5 V) of the pn junction from the potential of the gate.

In the ON state, the gate of the thyristor has a potential close to the potential of the anode terminal. Here, since the anode is set to the reference potential Vsub ("H" (0 V)), it is assumed that the gate is 0 V ("H"). In addition, the cathode of the thyristor in the ON state has a potential close to a potential obtained by subtracting the forward potential Vd (1.5 V) of the pn junction from the potential of the anode. Here, since the anode is set to the reference potential Vsub ("H" (0 V)), the cathode of the thyristor in the ON state has a potential close to −1.5 V (a negative potential having an absolute value greater than 1.5 V). Further, the potential of the cathode is set based on a relationship with a power source that supplies the current to the thyristor in the ON state.

When the cathode has a potential (a negative potential having a small absolute value, 0 V, or a positive potential) higher than a potential (a potential close to −1.5 V) required to maintain the ON state, the thyristor in the ON state changes to the OFF state (turned OFF).

Meanwhile, when the potential (a negative potential having a large absolute value), which is lower than the potential required to maintain the ON state, is continuously applied to the cathode of the thyristor in the ON state and a current (a holding current) for maintaining the ON state supplied, the thyristor is maintained in the ON state.

The setting thyristor S is stacked with the light emitting diode LED and connected in series to the light emitting diode LED. Therefore, a voltage applied to the cathode (n cathode layer 84) of the setting thyristor S is a voltage obtained by dividing the potential of the lighting signal φI into the voltage of the setting thyristor S and the voltage of the light emitting diode LED. Here, descriptions will be made assuming that the voltage applied to the light emitting diode LED is −1.7 V, as an example. Further, descriptions will be made assuming that −3.3 V is applied to the setting thyristor S when the setting thyristor S is in the OFF state. That is, it is assumed that the lighting signal φI ("Lo" to be described below) applied to turn on the light emitting diode LED is set to −5 V.

The voltage applied to the light emitting diode LED is changed according to a light emitting wavelength or a light amount, but in this case, the voltage ("Lo") of the lighting signal φI may be adjusted.

Since the thyristor is configured with a semiconductor formed of GaAs or the like, light may be emitted between the n gate layer 82 and the p gate layer 83 in the OH state. Further, the amount of light emitted from the thyristor depends on the area of the cathode and the current flowing between the cathode and the anode. Therefore, in a case where the light emitted from the thyristor is not used, unnecessary light may be inhibited, for example, by reducing the area of the cathode of the transfer thyristor T or by blocking the light by the electrode (the n ohmic electrode 323 of the transfer thyristor T1).

(Operation of Light Emitting Device 65)

Next, an operation of the light emitting device 65 will be described.

As described above, the light emitting device 65 is provided with light emitting chips C1-C40 (see FIG. 3 and FIGS. 4A and 4B).

Since the light emitting chips C1-C40 operate in parallel, it is sufficient to describe an operation of the light emitting chip C1.

<Timing Chart>

Figure 9:
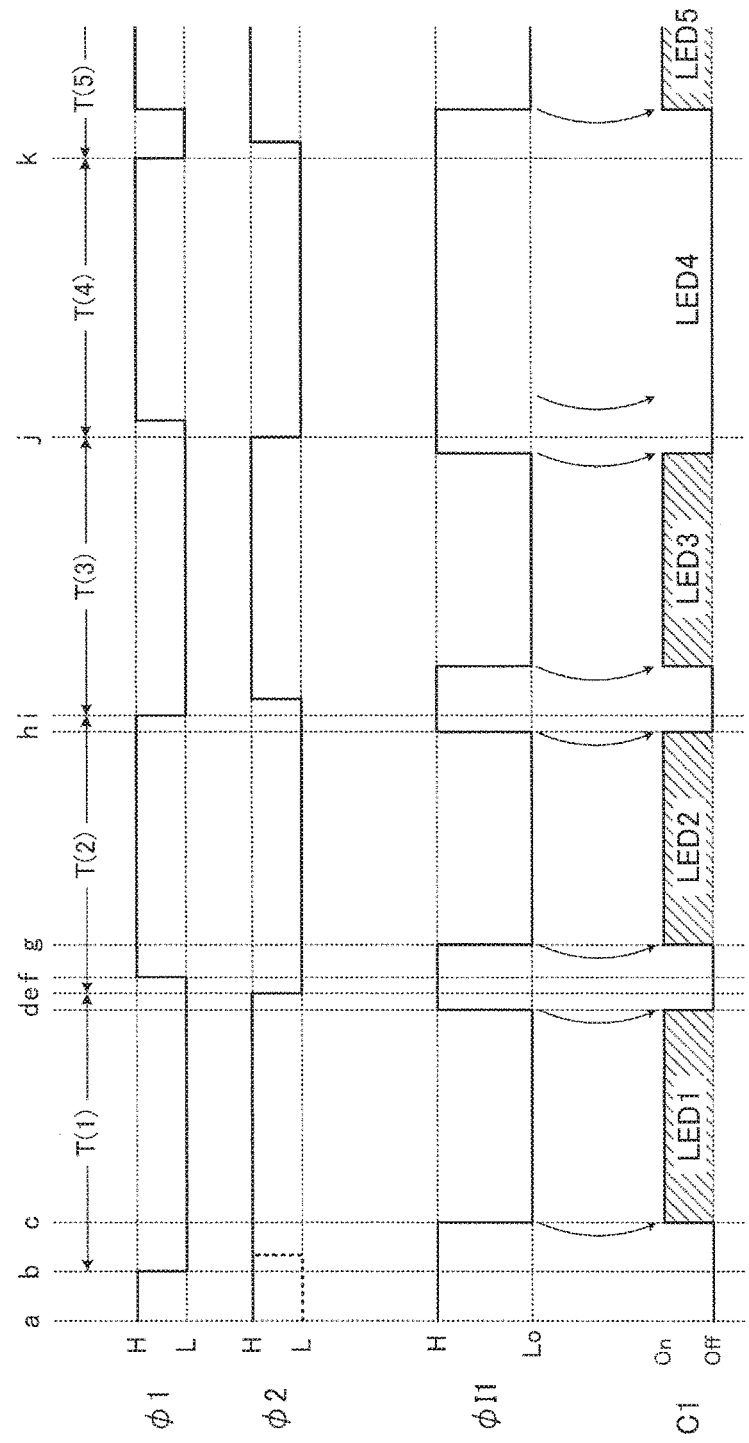
FIG. 9 is a timing chart for explaining operations of the light emitting device and the light emitting chips.

FIG. 9 is a tinting chart for explaining operations of the light emitting device 65 and the light emitting chips C.

FIG. 9 illustrates a timing chart of a portion that performs a control of turn-ON or turn-OFF (referred to as a lighting control) of the five light emitting diodes LED, that is, the light emitting diodes LED1-LED5 of the light emitting chip C1. Further, in FIG. 9, the light emitting diodes LED1, LED2, LED3, and LED5 of the light emitting chip C1 are turned ON, and the light emitting diode LED4 is turned OFF (non-lighting).

In FIG. 9, it is assumed that the time passes in alphabetical order from time a to time k. The light emitting diode LED1 is subjected to the control of turn-ON or turn-OFF (lighting control) in a period of time T(1), the light emitting diode LED2 is subjected to the lighting control in a period of time T(2), the light emitting diode LED3 is subjected to the lighting control in a period of time T(3), and the light emitting diode LED4 is subjected to the lighting control in a period of time T(4). Hereinafter, the light emitting diodes LED, each of which has a number equal to or greater than 5, are subjected to the lighting control.

Here, the periods of time T(1), T(2), T(3), . . . have the same length, and are referred to as a time period T if not distinguished.

The first transfer signal φ1 transmitted to the φ1 terminal (see FIG. 5 and FIGS. 6A and 6B) and the second transfer signal φ2 transmitted to the φ2 terminal (see FIG. 5 and FIGS. 6A and 6B) are signals having two potentials of "H" (0 V) and "L" (−3.3 V). Further, the first transfer signal φ1 and the second transfer signal φ2 have waveforms that are repeated an units of two successive time periods T (e.g., the tame period T(1)and the time period T(2)).

Hereinafter, "H" (0 V) and "L" (−3.3 V) may be abbreviated to "H" and "L" in some cases.

The first transfer signal φ1 changes from "H" (0 V) to "L" (−3.3 V) at the initial time b of the period of time T(1), and changes from "L" to "H" at time f. Further, the first transfer signal φ1 changes from "H" to "L" at the end time i of the period of time T(2).

The second transfer signal φ2 is "H" (0 V) at the initial time b of the period of time T(1), and changes from "H" (0 V) to "L" (−3.3V) at time e. Further, the second transfer signal φ2 changes from "L" to "H" at the end time i of the period of time T(2).

Upon comparing the first transfer signal φ1 and the second transfer signal φ2, the second transfer signal φ2 corresponds to the first transfer signal φ1 shifted backward by the time period T on the time axis. Meanwhile, the waveform of the second transfer signal φ2 in the period of time T(1) and a waveform of the second transfer signal θ2 in the period of time T(2), which are indicated by broken lines, are repeated after the period of time T(3). The reason why the waveform of the second transfer signal φ2 in the period of time T(1) is different from that after the period of time T(3) is that the period of time T(1) is a time period in which the light emitting device 65 begins to operate.

As described below, a set of transfer signals including the first transfer signal φ1 and the second transfer signal φ2 designates the light emitting diodes LED, which the numbers equal to the numbers of the transfer thyristors T in the ON state, as an object to be subjected to the control of turn-ON or turn-OFF (lighting control), by propagating the ON state of the transfer thyristors T in numerical order.

Next, the lighting signal φI1 transmitted to the φI terminal of the light emitting chip C1 will be described. Further, the lighting signals φI2-φI40 are transmitted to the other light emitting chips C2-C40, respectively. The lighting signal φI1 is a signal having two potentials of "H" (0 V) and "Lo" (−5 V).

Here, the lighting signal φI1 in the period of time T(1) for performing the lighting control on the light emitting diode LED1 of the light emitting chip C1 will be described. The lighting signal φI1 is "H" (0 V) at the initial time b of the period of time T(1), and changes from "H" (0 V) to "Lo" (−5 V) at time c. Further, the lighting signal φI1 changes from "Lo" to "H" at time d, and is maintained to "H" at time e.

The operations of the tight emitting device 65 and the light emitting chip C1 will be described in accordance with the timing chart illustrated in FIG. 9 while referring to FIGS. 4A and 4B and FIG. 5. Further, hereinafter, descriptions will be made with respect to the periods of time T(1) and T(2) in which the light emitting diodes LED1 and LED2 are subjected to a lighting control.

(1) Time a

<Light Emitting Device 65>

At time a, the reference potential supply unit 160 of the signal generating circuit 110 of the light emitting device 65 sets the reference potential Vsub to "H" (0 V). The power source potential supply unit 170 sets the power source potential Vga to "L" (−3.3). Then, the power source line 200a on the circuit board 62 of the light emitting device 65 becomes "H" (0 V) of the reference potential Vsub, and the Vsub terminal of each of the light emitting chips C1-C40 becomes "H". Likewise, the power source line 200b becomes "L" (−3.3 V) of the power source potential Vga, and the Vga terminal of each of the light emitting chips C1-C40 becomes "L" (see FIGS. 4A and 4B). Therefore, the power source line 71 of each of the light emitting chips C1-C40 becomes "L" (see FIG. 5).

The transfer signal generating unit 120 of the signal generating circuit 110 sets the first transfer signal φ1 and the second transfer signal φ2 to "H" (0 V). Then, the first transfer signal line 201 and the second transfer signal line 202 become "H" (see FIGS. 4A and 4B). Therefore, the φ1 terminal and the φ2 terminal of each of the light emitting chips C1-C40 become "H". The potential of the first transfer signal line 72 connected to the φ1 terminal through the current limit resistance R1 also becomes "H", and the second transfer signal line 73 connected to the ϕ1 terminal through the current limit resistance R2 also becomes "H" (see FIG. 5).

The lighting signal generating unit 140 of the signal generating circuit 110 sets each of the lighting signals ϕI1-ϕI40 to "H" (0 V). Then, the lighting signal lines 204-1-204-40 become "H" (see FIGS. 4A and 4B). Therefore, the ϕI terminal of each of the light emitting chips C1-C40 becomes "H" through the current limit resistance RI, and the lighting signal line 75 connected to the ϕI terminal also becomes "H" (0 V) (see FIG. 5).

<Light Emitting Chip C1>

Since the anode terminals of the transfer thyristor 1 and the setting thyristor S are connected to the Vsub terminal, the anode terminals are set to "H".

The cathode of each of the odd-numbered transfer thyristors T1, T3, T5, . . . is connected to the first transfer signal line 72, and thus set to "H" (0 V). The cathode of each of the even-numbered transfer thyristors T2, T4, T6, . . . is connected to the second transfer signal line 73, and thus set to "H". Therefore, both of the anode and the cathode of the transfer thyristor T are "H", and thus are in the OFF state.

The cathode terminal of the light emitting diode LED is connected to the lighting signal line 75 of "H" (0 V). That is, the light emitting diode LED and the setting thyristor S are connected to each other in series through the tunnel junction layer 85. Since the cathode of the light emitting diode LED is "H" and the anode of the setting thyristor S is "H", the light emitting diode LED and the setting thyristor S are in the OFF state.

As described above, the gate Gt1 is connected to the cathode of the start diode SD. The gate Gt1 is connected to the power source line 71 of the power source potential Vga ("L" (−3.3 V)) through the power source line resistance Rg1. Further, the anode terminal of the start diode SD is connected to the second transfer signal line 73, and connected to the ϕ2 terminal of "H" (0 V) through the current limit resistance R2. Therefore, the start diode SD is the forward bias, and the cathode (gate Gt1) of the start diode SD becomes a value (−1.5 V) obtained by subtracting the forward potential Vd (1.5 V) of the pn junction from the potential ("H" (0 V)) of the anode of the start diode SD. In addition, when the gate Gt1 becomes −1.5 V, the coupling diode D1 becomes the forward bias because the anode (gate Gt1) is −1.5 V and the cathode connected to the power source line 71 ("L" (−3.3 V)) through the power source line resistance Rg2. Therefore, the potential of the gate Gt2 becomes −3 V obtained by subtracting the forward potential Vd (1.5 V) of the pn junction from the potential (−1.5 V) of the gate Gt1. However, the situation in which the anode of the start diode SD is "H" (0 V) does not affect the gates Gt having a number equal to or larger than 3, and the potentials of the gates Gt become "L" (−3.3 V) which is the potential of the power source line 71.

Since the gate Gt is the gate Gs, the potential of the gate Gs is equal to the potential of the gate Gt. Therefore, the threshold voltage of the transfer thyristor T and the setting thyristor S becomes a value obtained by subtracting the forward potential Vd (1.5 V) of the pn junction from the potential of the gates Gt and Gs. That is, the threshold voltage of the transfer thyristor T1 and the setting thyristor S1 becomes −3 V, the threshold voltage of the transfer thyristor T2 and the setting thyristor S2 becomes −4.5 V, and the threshold voltage of the transfer thyristor A and the setting thyristor S having a number equal to or greater than 3 becomes −4.8 V.

(2) Time b

At time b illustrated in FIG. 9, the first transfer signal ϕ1 changes from "H" (0 V) to "L" (−3.3 V). Therefore, the light emitting device 65 begins to operate.

When the first transfer signal ϕ1 changes from "H" to "L", the potential of the first transfer signal line 72 changes from "H" (0 V) to "L" (−3.3 V) through the ϕ1 terminal and the current limit resistance R1. Then, the transfer thyristor T1 of which the threshold voltage is −3 V is turned ON. However, the odd-numbered transfer thyristors T including a cathode terminal connected to the first transfer signal line 72 and having a number equal to or larger than 3 cannot be turned ON because the threshold voltage thereof is −4.8 V. Meanwhile, the even-numbered transfer thyristors T cannot be turned ON because the second transfer signal ϕ2 is "H" (0 V), and the second transfer signal line 73 is "H" (0 V)

As the transfer thyristor T1 is turned ON, the potential of the first transfer signal line 72 becomes −1.5 V obtained by subtracting the forward potential Vd (1.5 V) of the pn junction from the potential ("H" (0 V)) of the anode.

When the transfer thyristor T1 is turned ON, the potential of the gate Gt1/Gs1 becomes "H" (0 V) which is the potential of the anode of the transfer thyristor T1 . Further, the potential of the gate Gt2 (gate Gs2) becomes −1.5 V, the potential of the gate Gt3 (gate Gs3) becomes −3 and the potential of the gates Gt (gate G1) having a number equal to or larger than 4 becomes "L".

Therefore, the threshold voltage of the setting thyristor S1 becomes −1.5 V, the threshold voltage of the transfer thyristor T2 and the setting thyristor S2 becomes −3 V, the threshold voltage of the transfer thyristor T3 and the setting thyristor S3 becomes −4.5 V, and the threshold voltage of the transfer thyristor T and the setting thyristors S having a number equal to or larger than 4 becomes −4.8 V.

However, since the first transfer signal line 72 is −1.5 V by the transfer thyristor T1 in the ON state, the odd-numbered transfer thyristor T in the OFF state is not turned ON. Since the second transfer signal line 73 is "H" (0 V), the even-numbered transfer thyristor T is not turned ON. Since the lighting signal line 75 is "H" (0 V), no light emitting diode LED is turned ON.

Immediately after time b (here, when a steady state is reached after a change in the thyristor or the like occurs due to the change in the potential of the signal at time b), the transfer thyristor T1 is in the ON state, and the other transfer thyristors T, setting thyristors S, and light emitting diodes LED are in the OFF state.

(3) Time c

At time c, the lighting signal ϕI1 changes from "H" (0 V) to "Lo" (−5 V).

When the lighting signal ϕI1 changes from "H" to "Lo", the lighting signal line 75 changes from "H" (0 V) to "Lo" (−5 V) through the current limit resistance RI and the ϕI terminal. Then, −3.3 V obtained by adding voltage 1.7 V applied to the light emitting diode LED is applied to the setting thyristor S1, the setting thyristor S1 of which the threshold voltage is −1.5 V is turned ON, and the light emitting diode LED1 is turned ON (emits light). Therefore, the potential of the lighting signal line 75 becomes potential close to −3.2 V (a negative potential having an absolute value greater than 3.2 V) Further, while the threshold voltage of the setting thyristor S2 is −3 V, the voltage applied to the setting thyristor S2 is −1.5 V obtained by adding voltage 1.7 V applied to the light emitting diode LED to −3.2 V. As a result, the setting thyristor S2 is not turned ON.

Immediately after time c, the transfer thyristor T1 and the setting thyristor S1 are in the ON state, and the light emitting diode LED1 is turned ON (emits light).

(4) Time d

At time d, the lighting signal ϕI1 changes from "Lo" (−5 V) to "H" (0 V).

When the lighting signal ϕI1 changes from "Lo" to "H", the potential of the lighting signal line 75 changes from −3.2 V to "H" through the current limit resistance RI and the ϕI terminal. Then, since both of the cathode of the light emitting diode LED1 and the anode of the setting thyristor S1 become "H", the setting thyristor S1 is turned OFF, and the light emitting diode LED1 is turned OFF (non-lighting). The lighting period of the light emitting diode LED1 is a period in which the lighting signal ϕT1 is "Lo" (−5 V) from time c at which the lighting signal ϕT1 changes from "H" to "Lo" to time d at which the lighting signal ϕI1 changes from "Lo" to "H".

Immediately after time d, the transfer thyristor T1 is in the ON state.

(5) Time e

At time e, the second transfer signal ϕ2 changes from "H" (0 V) to "L" (−3.3 V). Here, the period of time T(1) in which the light emitting diode LED1 is subjected to the lighting control is terminated, and the period of time T(2) in which the light emitting diode LED2 is subjected to the lighting control is initiated.

When the second transfer signal ϕ2 changes from "H" to "L", the potential of the second transfer signal line 73 changes from "H" to "L" through the ϕ2 terminal. As described above, the transfer thyristor T2 is turned ON because the threshold voltage thereof is −3 V. Therefore, the potential of the gate terminal Gt2 (gate terminal Gs2) becomes "H" (0 V), the potential of the gate Gt3 (gate Gs3) becomes −1.5 V, and the potential of the gate Gt4 (gate Gs4) becomes −3 V. Further, the potential of the gates Gt (gates Gs) having a number equal to or larger than 5 becomes −3.3 V.

Immediately after time e, the transfer thyristors T1 and T2 are in the ON state.

(6) Time f

At time f, the first transfer signal ϕ1 changes from "L" (−3.3 V) to "H" (0 V)

When the first transfer signal ϕ1 changes from "L" to "H", the Potential of the first transfer signal line 72 changes from "L" to "H" through the ϕ1 terminal. Then, the transfer thyristor T1 in the ON state is turned OFF as both of the anode and the cathode become "H". Then, the potential of the gate Gt1 (gate Gs1) is changed toward the power source potential Vga ("L" (−3.3 V)) of the power source line 71 through the power source line resistance Rg1. Therefore, the coupling diode D1 is brought into a state in which the potential is applied in a direction in which the current does not flow (reverse bias). Therefore, the situation in which the gate Gt2 (gate Gs2) is "H" (0 V) does not affect the gate Gt1 (gate Gs1). That is, the threshold voltage of the transfer thyristor T, which has the gate Gt connected by the coupling diode D of the reverse bias, is −4.8 V, and the transfer thyristor T is not turned ON when the first transfer signal ϕ1 or the second transfer signal ϕ2 is "L" (−3.3 V).

Immediately after time f, the transfer thyristor T2 is in the ON state.

(7) Others

At time g, when the lighting signal ϕT1 changes from "H" (0 V) to "Lo" (−5 V), the setting thyristor S1 is turned ON, and the light emitting diode LED2 is turned ON (emits light) like the setting thyristor S1 and the light emitting diode LED1 at time c.

At time h, when the lighting signal ϕI1 changes from "Lo" (−5 V) to "H" (0 V), the setting thyristor S2 is turned OFF, and the light emitting diode LED2 is turned OFF like the setting thyristor S1 and the light emitting diode LED1 at time d.

At time i, when the first transfer signal ϕ1 changes from "H" (0 V) to "L" (−3.3 V), the transfer thyristor T3 of which the threshold voltage is −3 V is turned ON like the transfer thyristor T1 at time b or the transfer thyristor T2 at time e. At time i, the period of time T(2) in which the light emitting diode LED2 is controlled to be turned ON ends, and the period of time T(3) in which the light emitting diode LED3 is controlled to be turned ON is initiated.

Hereafter, the operations described above are repeated.

When the light emitting diode LED is not turned ON (not light-emitted) and remains turned OFF (non-lighting), the lighting signal ϕI may remain as being "H" (0 V) like the lighting signal ϕI1 indicated from time j to time k in the period of time T(4) in which the light emitting diode LED4 in FIG. 9 is controlled to be turned ON. As a result, even though the threshold voltage of the setting thyristor S4 is −1.5 V, the setting thyristor S4 is not turned ON, and the light emitting diode LED4 remains turned OFF (non-lighting).

As described above, the gate terminals Gt of the transfer thyristors T are connected to each other by a coupling diode D. Therefore, when the potential of a gate Gt is changed, the potential of a gate Gt connected to the gate Gt having the changed potential through the coupling diode D of the forward bias is changed. Further, the threshold voltage of the transfer thyristor T, which has the gate having the changed potential, is changed. When the threshold voltage of the transfer thyristor T is higher than "L" (−3.3 V) (a negative value having a small absolute value), the transfer thyristor T is turned ON at a timing when the first transfer signal ϕ1 or the second transfer signal ϕ2 changes from "H" (0 V) to "L" (−3.3 V).

In addition, the setting thyristor S, the gate Gs of which is connected to the gate Gt of the transfer thyristor T in the ON state, has the threshold voltage of −1.5 V. Thus, when the lighting signal ϕI changes from "H" (0 V) to "Lo" (−5 V), the setting thyristor S is turned ON and the light emitting diode LED connected in series to the setting thyristor S is turned ON (light emitting).

That is, as the transfer thyristor T is brought into the ON state, the light emitting diode LED, which is an object to be subjected to a lighting control, is designated, and the lighting signal ϕI of "Lo" (−5 V) turns ON the setting thyristor S connected in series to the light emitting diode LED which is the object to be subjected to the lighting control, and turns on the light emitting diode LED.

The lighting signal ϕI of "H" (0 V) maintains the setting thyristor S in the OFF state, and maintains the light emitting diode LED in the non-lighting state. That is, the lighting signal ϕI sets the lighting/non lighting of the light emitting diode LED.

In this way, the lighting signal ϕI is set in accordance with the image data so as to control the lighting or non-lighting of the respective light emitting diodes LED.

(Method of Manufacturing Light Emitting Chip)

A method of manufacturing the light emitting chip C will be described. Here, descriptions will be made with reference to a cross-sectional view in FIG. 7 illustrating the island 301 in which the setting thyristor S and the light emitting diode LED are stacked.

FIGS. 10A to 10F are views for explaining a method of manufacturing the light emitting chip C. FIG. 10A is a process of forming the semiconductor stacked body, FIG. 10B is a process of forming the n ohmic electrode 321 and the light emission port protective layer 89, FIG. 10C is an etching process of exposing the tunnel junction layer 85, FIG. 10D is a process of forming the current blocking part β in the current confining layer 86b, FIG. 10E is an etching process of exposing the p gate layer 83, and FIG. 10F is a process of forming the p ohmic electrode 331 and the back electrode 91.

In FIGS. 10A to 10F, there are cases where the plural processes are collectively illustrated.

Hereinafter, the description will be made sequentially.

In the process of forming the semiconductor stacked body, as illustrated in FIG. 10A, the semiconductor stacked body is formed by sequentially and epitaxially growing the p anode layer 81, the n gate layer 82, the p gate layer 83, the n cathode layer 84, the tunnel junction layer 85, the p anode layer 86, the light emitting layer 87, and the n cathode layer 88 on the p-type substrate 80.

Here, the substrate 80 is described by taking p-type GaAs as an example, but may be formed of n-type GaAs or intrinsic (i) GaAs to which no impurity is added. In addition, the substrate 80 may be formed of InP, GaN, InAs, sapphire, Si, or the like. In a case where the substrate is changed, a material, which is approximately matched with a lattice constant of the substrate (including a distorted structure, a strain mitigation layer, a metamorphic growth), is used as a material stacked on the substrate in a monolithic manner. As an example, InAs, InAsSb, GaInAsSb, or the like is used on an InAs substrate, InP, InGaAsP, or the like is used on an InP substrate, GaN, AlGaN, or InGaN is used on a GaN substrate or a sapphire substrate, and Si, SiGe, GaP, or the like is used on a Si substrate. However, in a case where a material is attached to another support substrate after crystals are grown, it is not necessary that the semiconductor material is substantially lattice-matched with the support substrate.

For example, the p anode layer 81 is p-type $Al_{0.9}GaAs$ having an impurity concentration of $1\times10^{18}/cm^3$. The Al composition may be changed within a range from 0 to 1. Further, GaInP or the like may also be used.

For example, the n gate layer 82 is n-type $Al_{0.9}GaAs$ having an impurity concentration of $1\times10^{17}/cm^3$. The Al composition may be changed within a range from 0 to 1. Further, GaInP or the like may also be used.

For example, the p gate layer 83 is p-type $Al_{0.9}GaAs$ having an impurity concentration of $1\times10^{17}/cm^3$. The Al composition maybe changed within a range from 0 to 1. Further, GaInP or the like may also be used.

For example, the n cathode layer 84 is n-type $Al_{0.9}GaAs$ having an impurity concentration of $1\times10^{18}/cm^3$. The Al composition may be changed within a range from 0 to 1. Further, GaInP or the like may also be used.

The tunnel junction layer 85 is configured with a junction (see FIG. 10B) between the $n^{++}$ layer 85a formed by adding the n-type impurity at a high concentration and the $p^{++}$ layer 85b formed by adding the n-type impurity at a high concentration. For example, the $n^{++}$ layer 85a and the $p^{++}$ layer 85b have a high impurity concentration of $1\times10^{20}/cm^3$. Further, the impurity concentration of a typical junction is $10^{17}/cm^3$ to $10^{18}/cm^3$. The combinations of the $n^{++}$ layer 85a and the $p^{++}$ layer 85b (hereinafter, referred to as $n^{++}$ layer 85a/$p^{++}$ layer 85b) may include, for example, $n^{++}$GaInP/$p^{++}$GaAs, $n^{++}$GaInP/$p^{++}$AlGaAs, $n^{++}$GaAs/$p^{++}$GaAs, $n^{++}$AlGaAs/$p^{++}$AlGaAs, $n^{++}$InGaAs/$p^{++}$InGaAs, $n^{++}$GaInAsP/$p^{++}$GaInAsP, or $n^{++}$GaAsSb/$p^{++}$GaAsSb. Further, the combinations maybe changed to each other.

The p anode layer 86 is configured so that the lower p layer 86a, the current confining layer 86b, and the upper p layer 86c are stacked sequentially (see FIG. 10C).

For example, the lower p layer 86a and the upper p layer 86c are p-type $Al_{0.9}GaAs$ having an impurity concentration of $1\times10^{18}/cm^3$. The Al composition may be changed within a range from 0 to 1. Further, GaInP or the like may also be used.

For example, the current confining layer 86b is p-type AlGaAs having a high impurity concentration of AlAs or Al. The current confining layer 86b may be a layer that confines a current path as Al is oxidized to form $Al_2O_3$ such that the electric resistance becomes high.

The light emitting layer 87 is a quantum well structure in which a well layer and a barrier layer are alternately stacked. The well layer may be, for example, GaAs, AlGaAs, InGaAs, GaAsP, AlGaInP, GaInAsP, GaInP, or the like, and the barrier layer may be, for example, AlGaAs, GaAs, GaInP GaInAsP, or the like. Further, the light emitting layer 87 may be a quantum line (quantum wire) or a quantum box (quantum dot).

For example, the n cathode layer 88 is n-type $Al_{0.9}GaAs$ having an impurity concentration of $1\times10^{18}/cm^3$. The Al composition may be changed within a range from 0 to 1. Further, GaInP or the like may also be used.

For example, the semiconductor layers are stacked by metal organic chemical vapor deposition (MOCVD), molecular beam epitaxy (MBE), or the like, such that a semiconductor stacked body is formed.

In the process of forming the n ohmic electrode 321 and the light emission port protective layer 89 illustrated in FIG. 10B, the n ohmic electrode 321 is formed first on the n cathode layer 88.

The n ohmic electrode 321 is, for example, Au (AuGe) or the like that includes Ge by which an ohmic contact with the n-type semiconductor layer such as the n cathode layer 88 is easily obtained.

The n ohmic electrode 321 is formed by a lift-off method, for example.

Next, the light emission port protective layer 89 formed of a transparent material with respect to emitted light is formed on a light emission opening surrounded by the n ohmic electrode 321.

For example, the light emission port protective layer 89 is $SiO_2$, SiON, SiN, or the like.

The light emission port protective layer 89 is formed by the lift-off method or the like, for example.

In the etching process of exposing the tunnel junction layer 85 as illustrated in FIG. 10C, the n cathode layer 88, the light emitting layer 87, and the p anode layer 86 on the tunnel junction layer 85 are removed by etching in the periphery of the light emitting diode LED.

The etching may be performed by a wet etching using a sulfuric acid based an etching liquid (sulfuric acid:hydrogen peroxide solution:water=1:10:300 based on a weight ratio) or the like, or for example, by an anisotropy dry etching (RIE) using boron chloride or the like.

In the process of forming the current blocking part β in the current confining layer 86b as illustrated in FIG. 10D, the current blocking part β, which blocks the current, is formed by oxidizing, from a lateral side, the current confining layer 86b the lateral side of which is exposed by the etching process of exposing the tunnel junction layer 85. A portion, which remains without being oxidized, becomes the current passing part α.

The oxidation of the current confining layer 86b from the lateral side oxidizes Al of the current confining layer 86b made of AlAs, AlGaAs, or the like by vapor oxidation at 300 to 400° C., for example. In this case, the oxidation is performed from the exposed lateral side, and thus the current blocking part β is formed by $Al_2O_3$, which is an oxide of Al, in the periphery of the light emitting diode LED.

The current blocking part β may be formed by implantation (ion implantation) of oxygen ions ($O^+$) instead of the oxidation. That is, after the upper p layer 86c is formed after the current confining layer 86b is formed, the current blocking part β may be formed by implanting $O^+$ on a part to be the current blocking part β.

In the etching process of exposing the p gate layer 83 as illustrated in FIG. 10E, the p gate layer 83 is exposed by etching the tunnel junction layer 85 and the n cathode layer 84.

The etching may be performed by a wet etching using a sulfuric acid based an etching liquid (sulfuric acid:hydrogen peroxide solution:water=1:10:300 based on a weight ratio), or for example, by an anisotropy dry etching using boron chloride.

In the etching process of exposing the tunnel junction layer 85 as illustrated in FIG. 10C, when the p gate layer 83 is exposed instead of exposing the tunnel junction layer 85, there is a concern that Al included in the p gate layer 83 is oxidized in the process of forming the current blocking part β as illustrated in FIG. 10D. For this reason, when the Al included in the p gate layer 83 is oxidized, a surface becomes rough, or an adhesive property of the p ohmic electrode 331 to be described below deteriorates. Accordingly, the process of forming the current blocking part β is performed in a state in which the tunnel junction layer 85 is exposed.

In the process of forming the p ohmic electrode 331 and the back electrode 91 as illustrated in FIG. 10F, the p ohmic electrode 331 is formed on the p gate layer 83 first.

For example, the p ohmic electrode 331 is Au (AuZn) or the like including Zn by which an ohmic contact with the p-type semiconductor layer such as the p gate layer 83 is easily obtained.

The p ohmic electrode 331 is formed by the lift-off method, for example. In this case, other p ohmic electrodes may be simultaneously formed.

Next, the back electrode 91 is formed on the back surface of the substrate 80.

For example, the back electrode 91 is AuZn like the p ohmic electrode 331.

In addition to this, a process of forming the protective layer 90, a process of forming a through hole in the protective layer 90, a process of forming the wiring line 75, and the like are included.

The method of manufacturing the light emitting chip C has been described above with respect to the island 301 in which the setting thyristor S and the light emitting diode LED are stacked.

The islands 302-306, each of which includes the transfer thyristor T, the coupling diode D, the power source line resistance Rg, and the current limit resistances R1 and R2, are formed by adding a process of exposing a surface of the n cathode layer 84 and a process of forming the n ohmic electrodes 323, 324, and 325 to the above-described process.

The gate terminal Gs of the setting thyristor S having the p ohmic electrode 331 provided on the p gate layer 83 has been described above, but the gate terminal of the setting thyristor S may be provided on the n gate layer 82.

As described above, in the light emitting chip C according to the first exemplary embodiment, the setting thyristor S and the light emitting diode LED are stacked. Therefore, the light emitting chip C is a self-scanning type that sequentially turns on the light emitting diodes LED by the transfer thyristor T and the setting thyristor S. Therefore, the number of terminals provided in the light emitting chip C is reduced, and sizes of the light emitting chip C and the light emitting device 65 are reduced.

In some cases, the light emitting diode LED is not provided on the setting thyristor 5, and the setting thyristor S is used as the light emitting element. That is, in some cases, light emitting is used at the junction between the n gate layer 82 and the p gate layer 83 in the ON state of the setting thyristor S. In this case, transfer characteristics and light emitting characteristics may not be set separately (independently). For this reason, it is difficult to achieve a high driving speed, a high output of light, a high efficiency, a low power consumption, and low costs.

For example, a thyristor (setting thyristor S) is to be as a light emitting element to emit 780 nm light. In this case, the Al composition is set to 30% in order to configure the quantum well structure by using AlGaAs. In this case, when an etching for exposing a gate is performed, Al is oxidized, and thus the gate terminal may not be formed.

In contrast, in the first exemplary embodiment, light emission is performed by the light emitting diode LED, and transfer is performed by the transfer thyristor T and the setting thyristor S. The light emission and the transfer are separated from each other. It is not necessary that the setting thyristor S emits light. Therefore, it is possible to improve the light emitting characteristics or the like by applying the quantum well structure to the light emitting diode LED, and to improve the transfer characteristics or the like by the transfer thyristor T and the setting thyristor S. That is, the light emitting diode LED of the light emitting unit 102 and the transfer thyristor T and the setting thyristor S of the transfer unit 101 may be separately (independently) set. Therefore, it is easy to achieve a high driving speed, a high output of light, a high efficiency, a low power consumption, and low costs.

In the first exemplary embodiment, the light emitting diode LED and the setting thyristor S are stacked through the tunnel junction layer 85. In this case, the light emitting diode LED is reverse biased in the tunnel junction layer 85, but the tunnel junction has characteristics in which the current flows even in the reverse bias state.

When the tunnel junction layer 85 is not provided, a junction between the light emitting diode LED and the setting thyristor S is reverse biased. For this reason, voltage, by which the junction of reverse bias breaks down, is applied to allow the current to flow to the light emitting diode LED and the setting thyristor S. That is, the driving voltage becomes high.

That is, since the light emitting diode LED and the setting thyristor S are stacked through the tunnel junction layer 85, the driving voltage is restricted to be low compared to the case where the tunnel junction layer 85 is not interposed.

The setting thyristor S may emit light. By extracting the light emitted from the setting thyristor S to overlap with the light emitted from the light emitting diode LED, the light amount is increased.

The current confining layer 86b provided in the p anode layer 86 of the light emitting diode LED may be provided in the n cathode layer 88 of the light emitting diode LED.

Hereinafter, modifications of the light emitting chip C according to the first exemplary embodiment will be described. In the modifications described below, the parts in the island 301 of the light emitting chip C, where the setting thyristor S and the light emitting diode LED are stacked, are different. Because the other configurations are similar to those of the light emitting chip C described above, different parts will be described, and descriptions of similar parts will be omitted.

(Modification 1-1 of Light Emitting Chip C according to First Exemplary Embodiment)

Figure 11:
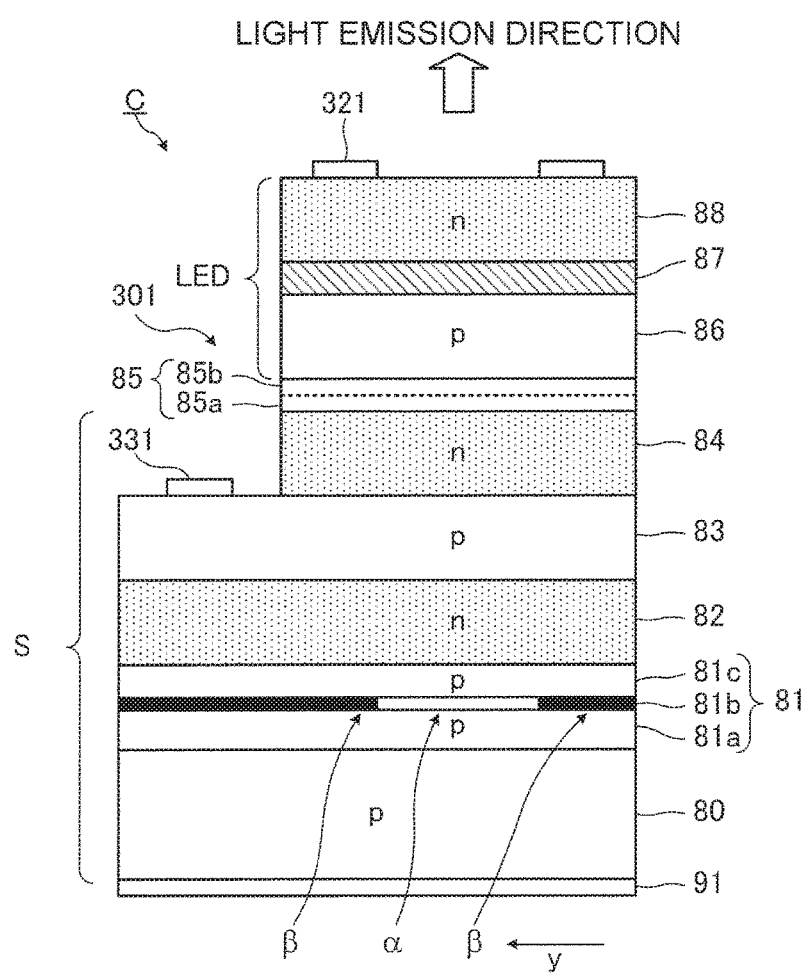
FIG. 11 is an enlarged cross-sectional view of an island in which a setting thyristor and a light emitting diode are stacked, for explaining modification 1-1.

FIG. 11 is an enlarged cross-sectional view of the island 301 in which the setting thyristor S and the light emitting diode LED are stacked, for explaining modification 1-1.

In modification 1, the current confining layer (a current confining layer 81b in modification 1-1) is provided in the p anode layer 81 instead of the p anode layer 86. That is, the p anode layer 81 includes a lower p layer 81a, the current confining layer 81b, and an upper p layer 81c. The other configurations are similar to those of the light emitting chip C according to the first exemplary embodiment.

In modification 1-1, the light emitting chip is manufactured by changing the method of manufacturing the light emitting chip C according to the first exemplary embodiment as illustrated in FIGS. 10A to 10F. That is, since the current confining layer 81b is provided in the p anode layer 81, the etching process of exposing the tunnel junction layer 85 in FIG. 10C and the process of forming the current blocking part β in FIG. 10D are not required in the method of manufacturing a light emitting chip C, to which the first exemplary embodiment illustrated in FIGS. 10A to 10F is applied. That is, the n cathode layer 88, the light emitting layer 87, the p anode layer 86, the tunnel junction layer 85, and the n cathode layer 84 may be etched in the etching process of exposing the p gate layer 83 in FIG. 10E.

Since the flow of a current to the current passing part α at the central portion of the light emitting diode LED is restricted even in the light emitting chip C of modification 1, power consumed by the non-light-emitting recombination is suppressed, and as a result, the power consumption is reduced, and the light extraction efficiency is improved.

In addition, the current confining layer 81b provided in the p anode layer 81 of the setting thyristor S may be provided in he n cathode layer 84 of the setting thyristor S.

(Modification 1-2 of Light Emitting Chip C according to First Exemplary Embodiment)

Figure 12:
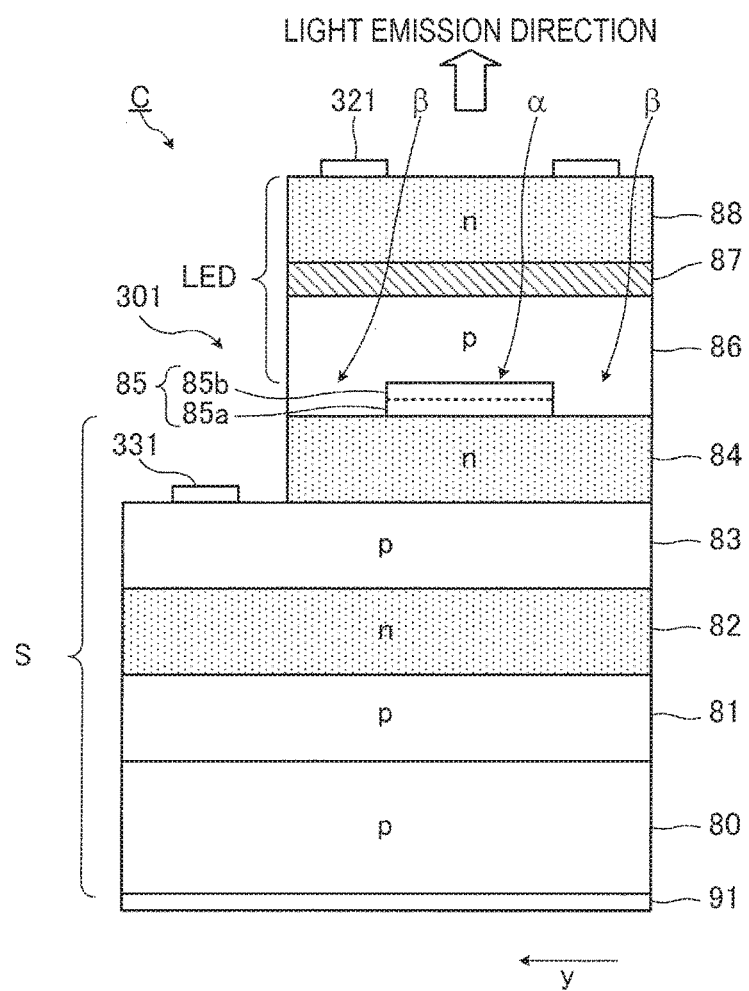
FIG. 12 is an enlarged cross-sectional view of an island in which a setting thyristor and a light emitting diode are stacked, for explaining modification 1-2.

FIG. 12 is an enlarged cross-sectional view of the island 301 in which the setting thyristor S and the light emitting diode LED are stacked, for explaining modification 1-2.

In modification 1-2, the tunnel junction layer 85 is provided at a portion corresponding to the current passing part α instead of the current confining layer 86b. The other configurations are similar to those of the light emitting chip C according to the first exemplary embodiment.

As described above, in the tunnel junction layer 85, the current easily flows in the reverse bias state. However, in a junction between the n cathode layer 84 and the p anode layer 86 other than the tunnel junction, the current hardly flows in the reverse bias state in which a breakdown does not occur.

Therefore, when the tunnel junction layer 85 is provided at a portion corresponding to the current passing part α, the current, which flows to the light emitting diode LED, is restricted to the central portion.

The light emitting chip C of modification 1-2 is manufactured by changing the method of manufacturing the light emitting chip C according to the first exemplary embodiment as illustrated in FIGS. 10A to 10F. That is, in FIG. 10A, the p anode layer 81, the n gate layer 82, the p gate layer 83, the n cathode layer 84, and the tunnel junction layer 85 are sequentially and epitaxially grown on the substrate 80. Thereafter, the tunnel junction layer 85 of the portion, which becomes the current blocking part β, is removed, and the tunnel junction layer 85 of the portion, which becomes the current passing part α, remains. Thereafter, the p anode layer 86 is stacked to fill the periphery of the remaining tunnel junction layer 85. Further, the light emitting layer 87 and the n cathode layer 88 are sequentially and epitaxially grown. Further, the periphery of the remaining tunnel junction layer 85 may be filled with the n cathode layer 84, instead of the p anode layer 86.

In the light emitting chip C of modification 1-2, like the light emitting chip C of modification 1, the etching process of exposing the tunnel junction layer 85 in FIG. 10C and the process of forming the current blocking part β in FIG. 10D are not required. Further, in the etching process of exposing the p gate layer 83 in FIG. 10E, the n cathode layer 88, the light emitting layer 87, the p anode layer 86, the tunnel junction layer 85, and the n cathode layer 84 may be etched.

The light emitting chip C of modification 1-2 may also be applied to a case where a semiconductor material to which the vapor oxidation is difficult to be applied is used.

Second Exemplary Embodiment

In a light emitting chip C according to a second exemplary embodiment, the light emitting layer 87 is interposed between two distributed. Bragg reflector (DBR) layers (hereinafter, referred to as a DBR layer). The DBR layer is configured so that plural semiconductor layers having refractive index differences are stacked. Further, the DBR layer is configured to reflect light emitted from the light emitting diode LED.

The other configurations of the light emitting chip C except for the island 301 in which the setting thyristor S and the light emitting diode LED are stacked are similar to those in the first exemplary embodiment. Therefore, different parts will be described, and descriptions of similar parts will be omitted.

Figure 13:
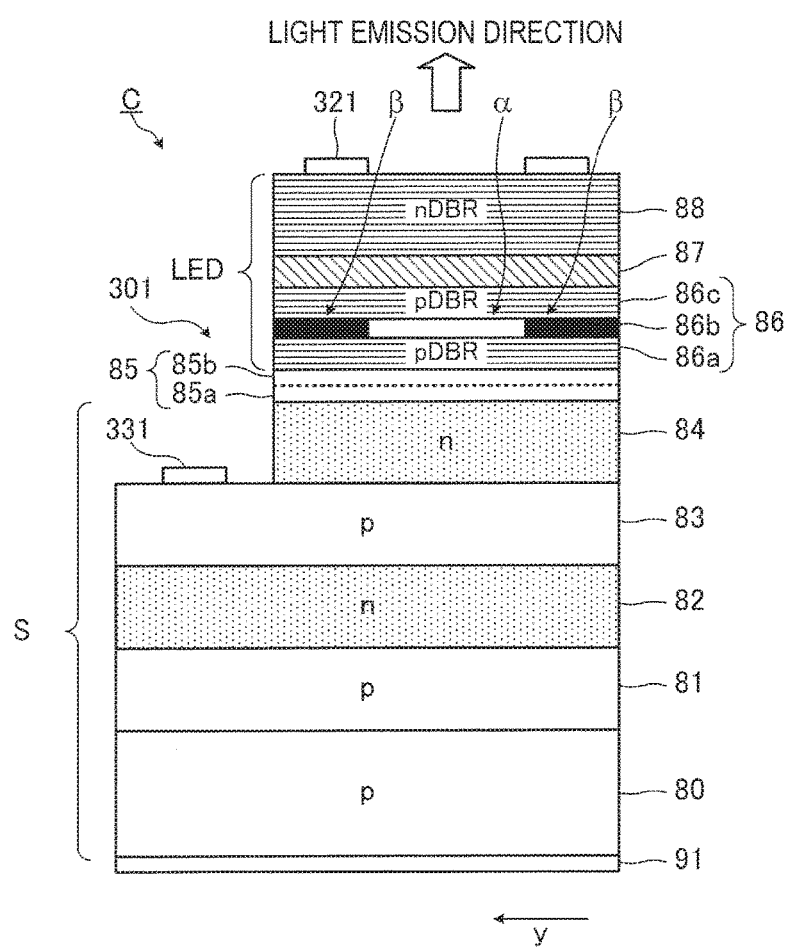
FIG. 13 is an enlarged cross-sectional view of an island in which a setting thyristor and a light emitting diode of a light emitting chip according to a second exemplary embodiment are stacked.

FIG. 13 is an enlarged cross-sectional view of the island 301 in which the setting thyristor S and the light emitting diode LED of the light emitting chip C according to the second exemplary embodiment are stacked.

In the light emitting chip C according to the second exemplary embodiment, the p anode layer 86 and the n cathode layer 88 are configured as a DBR layer. The p anode layer 86 includes the current confining layer 86b. That is, the p anode layer 86 is formed the lower p layer 86a, the current confining layer 86b, and the upper p layer 86c are stacked sequentially. The lower p layer 86a and the upper p layer 86c are configured as the DBR layer.

The lower p layer 86a, the upper p layer 86c, and the n cathode layer 88 may be referred to as a lower p (DBR) layer 86a, an upper p (DBR) layer 86c, and an n (DBR) cathode layer 88, respectively.

The DBR layer is configured with a combination of a low refractive index layer having a high. Al composition of, for example, $Al_{0.9}Ga_{0.1}As$ and a high refractive index layer having a low Al composition of, for example, $Al_{0.2}Ga_{0.8}As$. The film thickness (optical path length) of each of the low refractive index layer and the high refractive index layer is set to, for example, 0.25 (¼) of a center wavelength. Further, the Al composition ratio between the low refractive index layer and the high refractive index layer may be changed within a range from 0 to 1.

The film thickness (optical path length) of the current confining layer 86*b* depends on an adopted structure. In a case where an extraction efficiency or process reproducibility is considered important, the film thickness may be set to an integer multiple of the film thickness (optical path length) of each of the low refractive index layer and the high refractive index layer that constitute the DBR layer, and for example, the film thickness is set to 0.75 (¾) of a center wavelength. Further, in the case of odd number times, the current confining layer 86*b* maybe interposed between the high refractive index layer and the high refractive index layer. In addition, in the case of even number times, the current confining layer 86*b* may be interposed between the high refractive index layer and the low refractive index layer. That is, the current confining layer 86*b* may be provided to suppress the disturbance of period of refractive index caused by the DBR layer. On the contrary, in a case where it is intended to reduce the influence of an oxidized portion (refractive index or distortion), the film thickness of the current confining layer 86*b* maybe several tens of nanometers, and maybe inserted into a portion of a node of a standing wave that occurs in the DBR layer.

The light emitting chip C according to the second exemplary embodiment is manufactured by partially changing the manufacturing method according to the first exemplary embodiment as illustrated in FIGS. 10A to 10F. That is, in the process of forming the semiconductor stacked body in FIG. 10A, the lower p layer 86*a* and the upper p layer 86*c* of the p anode layer 86 and the n cathode layer 88 are formed as the DBR layer. Further, a part of a semiconductor layer, such as a part of the lower p layer 86*a* or the upper p layer 86*c* of the p anode layer 86 or a part of the n cathode layer 88, may be configured as the DBR layer. The same applies to the other cases.

The p (DBR) anode layer 86 and the n (DBR) cathode layer 88 constitute a resonator (cavity), and light emitted from the light emitting layer 87 is intensified by resonance and output. That is, in the light emitting chip C according to the second exemplary embodiment, a resonance type light emitting diode LED is stacked on the setting thyristor S (resonance cavity light emitting diode on thyristor).

Since the current confining layer 86*b* is provided, power consumed by the non-light-emitting recombination is suppressed, and as a result, power consumption is reduced, and a light extraction efficiency is improved.

In the light emitting chip C of the second exemplary embodiment, because the light emitted from the setting thyristor S reflected by the p (DBR) anode layer 86, the extraction is suppressed.

The light emitting chip C according to the second exemplary embodiment operates in accordance with the timing chart in FIG. 9, as described in the first exemplary embodiment.

The current confining layer 86*b*, which is provided in the p anode (DBR) layer 86 of the light emitting diode LED, may be provided in the n cathode (DBR) layer 88 of the light emitting diode LED, and may also be provided in the p anode layer 81 or the n cathode layer 84 of the setting thyristor S.

Modifications of the light emitting chip C according to the second exemplary embodiment will he described below. In the modifications described below, the parts in the island 301 of the light emitting chip C, where the setting thyristor S and the light emitting diode LED are stacked, are different. Because the other configurations are similar to those of the light emitting chip C described above, descriptions of similar parts will be omitted, and different parts will be described.

(Modification 2-1 of Light Emitting Chip C according to Second Exemplary Embodiment)

Figure 14:
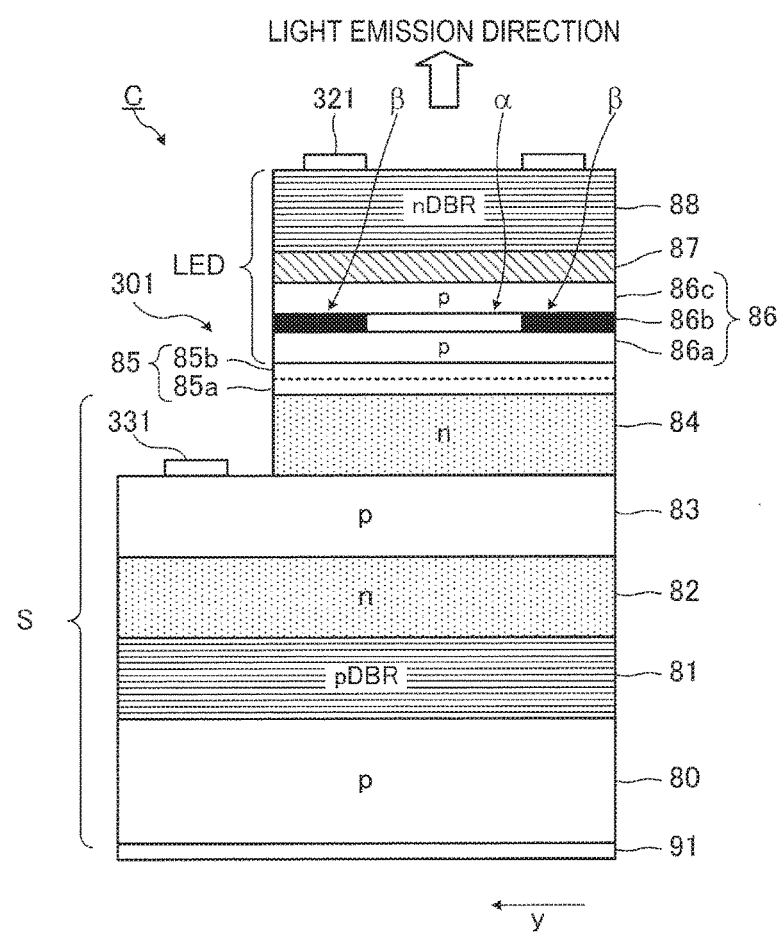
FIG. 14 is an enlarged cross-sectional view of an island in which a setting thyristor and a light emitting diode are stacked, for explaining modification 2-1.

FIG. 14 is an enlarged cross-sectional view of the island 301 in which the setting thyristor S and the light emitting diode LED are stacked, for explaining modification 2-1.

In modification 2-1, the p (DBR) anode layer 86 of the light emitting chip C illustrated in FIG. 13 is configured as the p anode layer 86 that is not configured as the DBR layer, and instead, the p anode layer 81 is configured as the DBR layer. Therefore, the p anode layer 81 is referred to as a p (DBR) anode layer 81. The other configurations are similar to those of the light emitting chip C according to the second exemplary embodiment.

In modification 2-1, the p (DBR) anode layer 81 and the n (DBR) cathode layer 88 constitute a resonator (cavity), and light emitted from the light emitting layer 87 is intensified by resonance and output. Further, light emitted from the junction between the n gate layer 82 and the p gate layer 83 of the setting thyristor S is also intensified by resonance and output. That is, the light emitted from the setting thyristor S may be extracted to overlap with the light emitted from the light emitting diode LED.

The light emitting chip C of modification 2-1 is manufactured by partially changing the manufacturing method according to the first exemplary embodiment as illustrated in FIGS. 10A to 10F. That is, in the process of forming the semiconductor stacked body in FIG. 10A, the p (DBR) anode layer 81 and the n anode (DBR) layer 88 may be formed as the DBR layer.

The current confining layer 86*b*, which is provided in the p anode layer 86 of the light emitting diode LED, may be provided in the n cathode layer 88 of the light emitting diode LED, and may also be provided in the p anode (DBR) layer 81 or the n cathode layer 84 of the setting thyristor S.

Like modification 1-2 of the light emitting chip C according to the first exemplary embodiment, current confinement may be performed by the tunnel junction layer 85.

(Modification 2-2 of Light Emitting Chip C according to Second Exemplary Embodiment)

Figure 15:
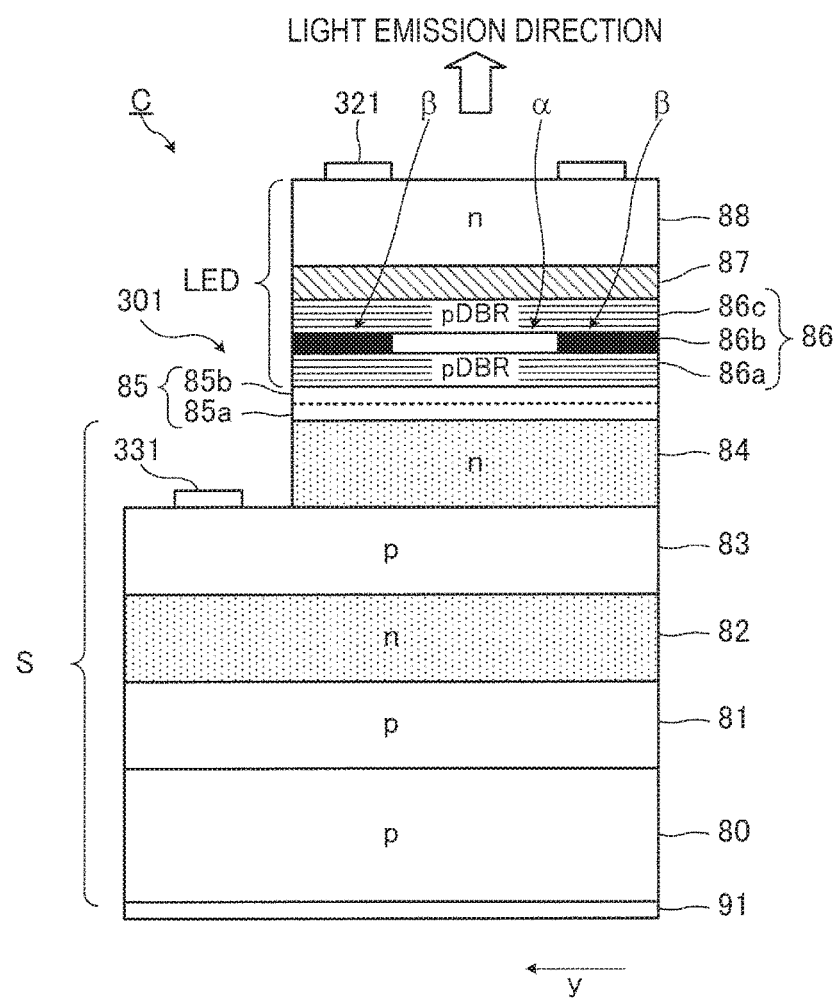
FIG. 15 is an enlarged cross-sectional view of an island in which a setting thyristor and a light emitting diode are stacked, for explaining modification 2-2.

FIG. 15 is an enlarged cross-sectional view of the island 301 in which the setting thyristor S and the light emitting diode LED are stacked, for explaining modification 2-2.

In modification 2-2, the n (DBR) cathode layer 88 of the light emitting chip C illustrated in FIG. 13 is configured as the n cathode layer 88 instead of being configured as the DBR layer. The other configurations are similar to those of the light emitting chip C according to the second exemplary embodiment.

In the light emitting chip C of modification 2-2, the p anode (DBR) layer 86 is provided at a dower (substrate 80) side of the light emitting layer 87. In this case, because a reflectivity of 30% is obtained at an interface between the n cathode layer 88 and air, light emitted from the light emitting layer 87 is intensified by resonance and output.

Light directed toward the substrate 80, of the light emitted from the light emitting layer 87, is reflected, and directed toward the emission port. Therefore, the light use efficiency is improved compared with a case where the p anode layer 86 is not the DBR layer.

The light emitting chip C of modification 2-2 is manufactured by partially changing the manufacturing method according to the first exemplary embodiment as illustrated in FIGS. 10A to 10F. That is, in the process of forming the semiconductor stacked body in FIG. 10A, the lower p layer 86a and the upper p layer 86c of the p anode layer 86 may be formed as the DBR layer.

The current confining layer 86b, which is provided in the p anode (DBR) layer of the light emitting diode LED, may also be provided in the n cathode layer 88 of the light emitting diode LED, and may also be provided in the p anode layer 81 or the n cathode layer 84 of the setting thyristor S.

Like modification 1-2 of the light emitting chip C according to the first exemplary embodiment, current confinement may be performed by the tunnel junction layer 85.

Third Exemplary Embodiment

In a light emitting chip C according to a third exemplary embodiment, a laser diode is used as the light emitting element instead of the light emitting diodes LED in the first exemplary embodiment and the second exemplary embodiment.

The other configurations except for the light emitting chip C are similar to those in the first exemplary embodiment. Therefore, the light emitting chip C will be described, and the descriptions of similar parts will be omitted.

Figure 16:
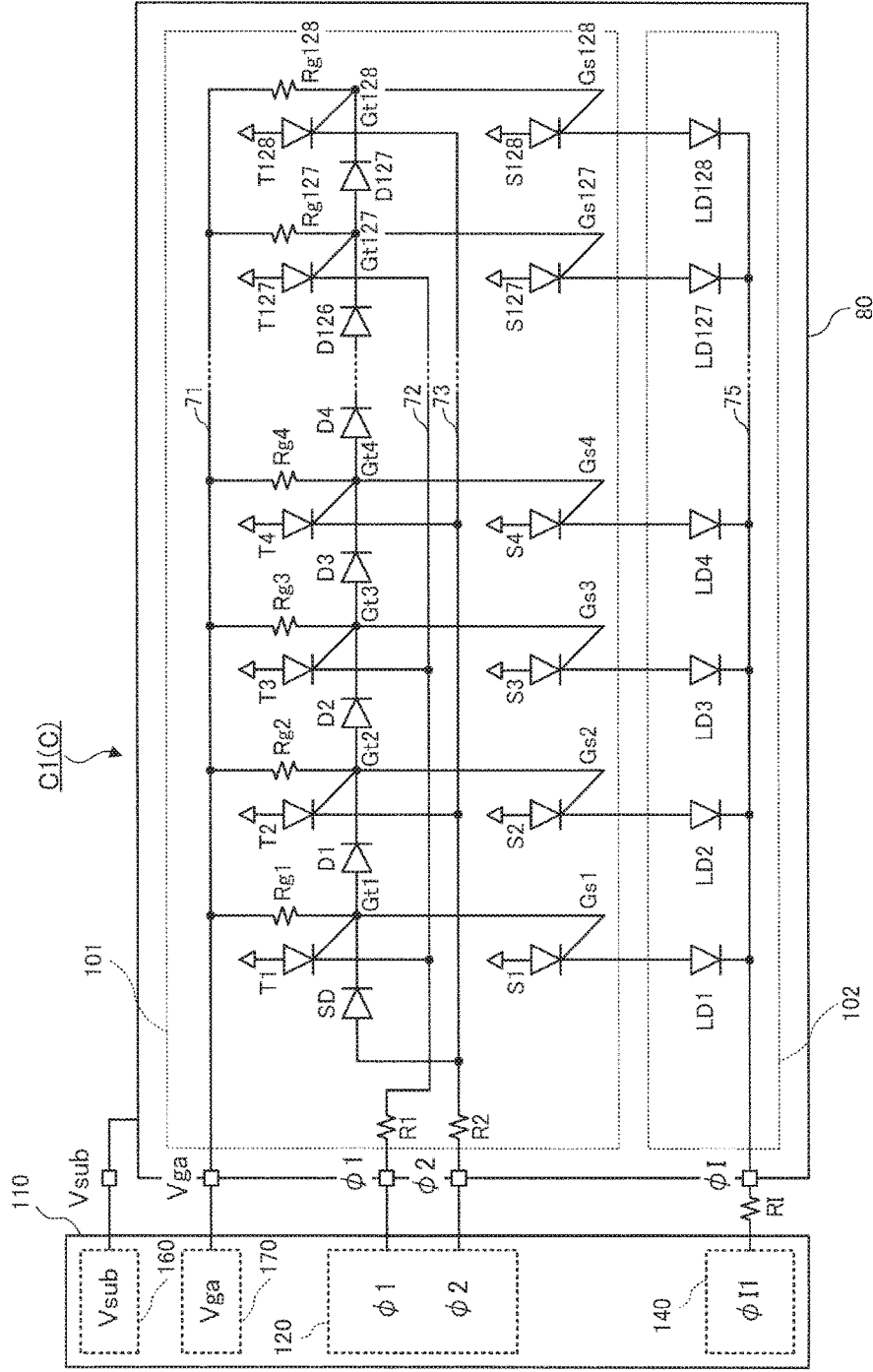
FIG. 16 is an equivalent circuit diagram for explaining a circuit configuration of light emitting chip equipped with a self-scanning light-emitting device (SLED) array according to a third exemplary embodiment.

FIG. 16 is an equivalent circuit diagram for explaining a circuit configuration of the light emitting chip C equipped with a self-scanning light-emitting device (SLED) array according to the third exemplary embodiment. The light emitting diodes LED1-LED128 of FIG. 5 according to the first exemplary embodiment are laser diodes LD1-LD128 (referred to as a laser diode ID if not distinguished). Because the other configurations are similar to those in FIG. 5, the descriptions thereof will be omitted.

In the first exemplary embodiment, even in the top plan layout view and the cross-sectional view of the light emitting chip C illustrated in FIGS. 6A and 6B, the laser diode LD may be substituted for the light emitting diode LED. Therefore, the top plan layout view and the cross-sectional view of the light emitting chip C according to the third exemplary embodiment will be omitted.

In the light emitting chip C according to the third exemplary embodiment, the setting thyristor S and the laser diode LD are stacked (laser diode on thyristor).

In the laser diode LD, the light emitting layer 87 is interposed between two clad layers (hereinafter, referred to as the clad layer). The clad layer is a layer having a refractive index greater than that of the light emitting layer 87. Light emitted from the light emitting layer 87 is reflected at an interface between the light emitting layer 87 and the clad layer, and the light is confined in the light emitting layer 87. Further, laser oscillation occurs as the light resonates by a resonator configured between lateral sides of the light emitting layer 87. The light emitting layer 87 may be referred to as an active layer.

Figure 17:
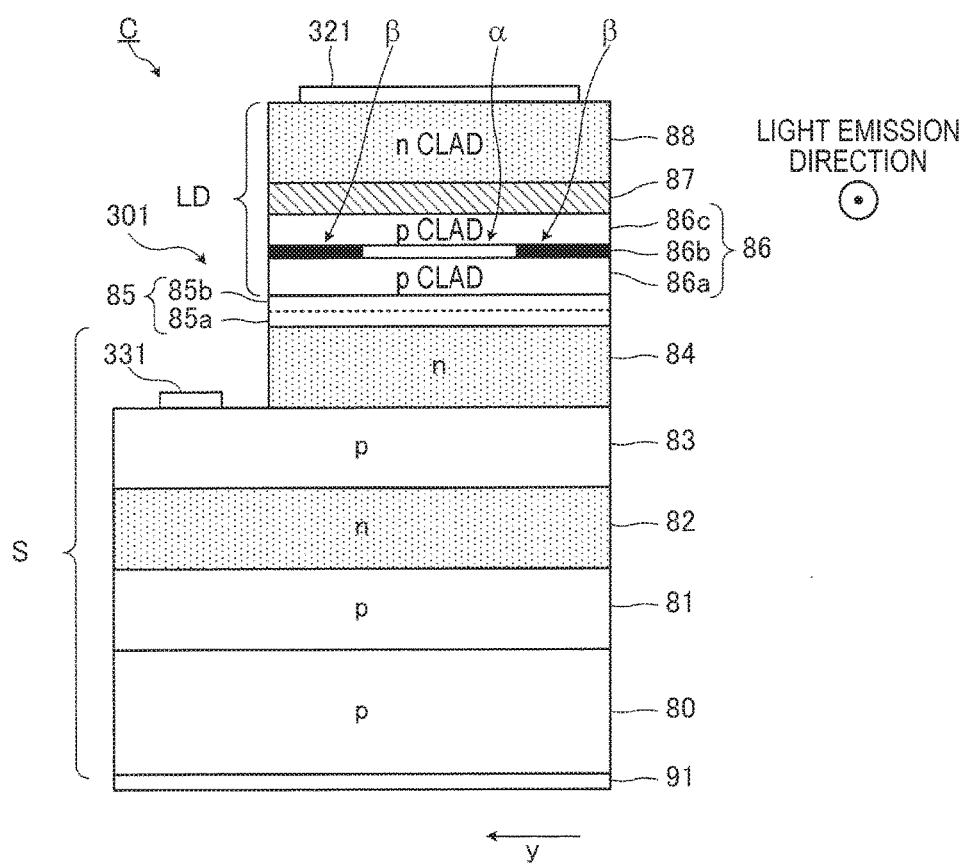
FIG. 17 is an enlarged cross-sectional view of an island in which a setting thyristor and a laser diode of the light emitting chip according to the third exemplary embodiment are stacked.

FIG. 17 is an enlarged cross-sectional view of the island 301 in which the setting thyristor S and the laser diode LD of the light emitting chip C according to the third exemplary embodiment are stacked.

In the light emitting chip C, the p anode layer 86 is configured with a p-type clad layer including the current confining layer 86b. That is, in the p anode layer 86, the lower p layer 86a and the upper p layer 86c are configured as the clad layer. Further, the n cathode layer 88 is configured as the clad layer. Further, the lower p layer 86a, upper p layer 86c, and the n cathode layer 88 may be referred to as a lower p (clad) layer 86a, an upper p (clad) layer 86c, and an n cathode (clad) layer 88, respectively. Further, the entire p anode layer 86 is referred to as a p anode (clad) layer 86 in some cases.

For example, the lower p (clad) layer 86a and the upper p (clad) layer 86c of the p anode (clad) layer 86 are p-type $Al_{0.9}GaAs$ having an impurity concentration of $5 \times 10^{17}/cm^3$. The Al composition may be changed within a range from 0 to 1. Further, GaInP or the like may also be used.

For example, the n cathode (clad) layer 88 is n-type $Al_{0.9}GaAs$ having an impurity concentration of $5 \times 10^{17}/cm^3$. The Al composition may be changed within a range from 0 to 1. Further, GaInP or the like may also be used.

The p anode (clad) layer 86, the n cathode (clad) layer 88, and the light emitting layer 87 are set such that light emitted from the light emitting layer 87 is confined between the p anode (clad) layer 86 and the n cathode (clad) layer 88 and the laser oscillation occurs between the lateral sides (end faces) of the light emitting layer 87. In this case, the light is emitted from the lateral sides (end faces) of the light emitting layer 87.

Therefore, the n ohmic electrode 321 is provided on the entire surface of the n cathode (clad) layer 88.

In FIG. 17, a light emission direction is indicated as a direction orthogonal to a y direction, that is, a −x direction illustrated in FIG. 6A. This is for the convenience of description, and the light may also be emitted in a −y direction. In addition, the light may also be directed in a direction perpendicular to the substrate 80 through a mirror or the like. The same also applies to the other light emitting chips C and the other modifications.

As the current confining layer 86h is provided, power consumed by the non-light-emitting recombination is suppressed, and as a result, the power consumption is reduced, and the light extraction efficiency is improved.

The light emitting chip C according to the third exemplary embodiment is manufactured by partially changing the manufacturing method according to the first exemplary embodiment as illustrated in FIGS. 10A to 10F. That is, in the process of forming the semiconductor stacked body in FIG. 10A, the lower p layer 86a and the upper p layer 86c of the p anode layer 86 are formed as the clad layer. Likewise, the n cathode layer 88 is formed as the clad layer.

The light emitting chip C according to the third exemplary embodiment operates in accordance with the timing chart in FIG. 9, as described in the first exemplary embodiment.

The current confining layer 86b, which is provided in the p anode (clad) layer 86 of the laser diode LD, may be provided in the n cathode (clad) layer 88 of the laser diode LD, and may also be provided in the p anode layer 81 or the n cathode layer 84 of the setting thyristor S.

Hereinafter, modifications of the light emitting chip C according to the third exemplary embodiment will be described. In the modifications described below, portions of the island 301 of the light emitting chip C, where the setting thyristor S and the laser diode ED are stacked, are different. Because the other configurations are similar to those of the light emitting chip C described above, different parts will be described, and descriptions of similar parts will be omitted.

(Modification 3-1 of Light Emitting Chip C according to Third Exemplary Embodiment)

Figure 18:
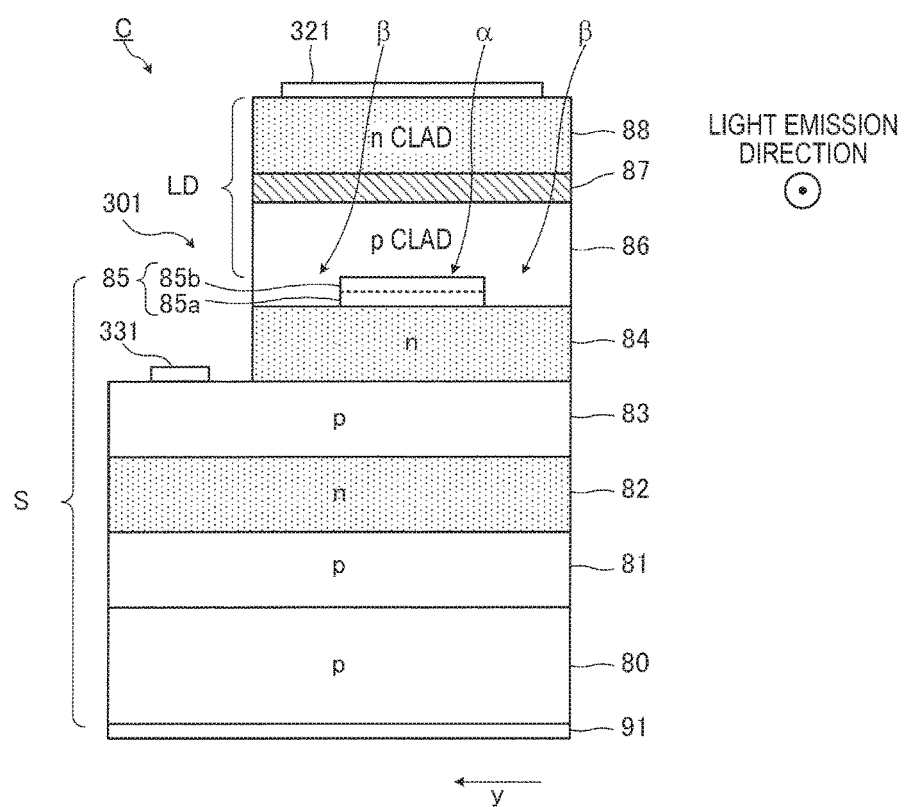
FIG. 18 is an enlarged cross-sectional view of an island in which a setting thyristor and a laser diode are stacked, for explaining modification 3-1.

FIG. 18 is an enlarged cross-sectional view of the island 301 in which the setting thyristor S and the laser diode LD are stacked, for explaining modification 3-1.

In modification 3-1, like modification 1-2 in the first exemplary embodiment illustrated in FIG. 12, the tunnel junction layer 85 is provided at a portion corresponding to the current passing part α instead of the current confining layer 86*b*. The other configurations are similar to those of the light emitting chip C according to the first exemplary embodiment.

As described above, in the tunnel junction layer 85, the current easily flows in the reverse bias state. However, in the junction between the n cathode layer 84 and the p anode layer 86, the current hardly flows in a reverse bias state in which a breakdown does not occur.

Therefore, when the tunnel junction layer 85 is provided at a portion corresponding to the current passing part a, the current flowing to the laser diode LD is restricted to the central portion.

Modification 3-1 is manufactured in the same way as modification 1-2 in the first exemplary embodiment. Further, the lower p layer 86*a* and the upper p layer 86*c* of the p anode layer 86 and the n cathode layer 88 may be formed as the clad layer.

(Modification 3-2 of Light Emitting Chip C according to Third Exemplary Embodiment)

Figure 19:
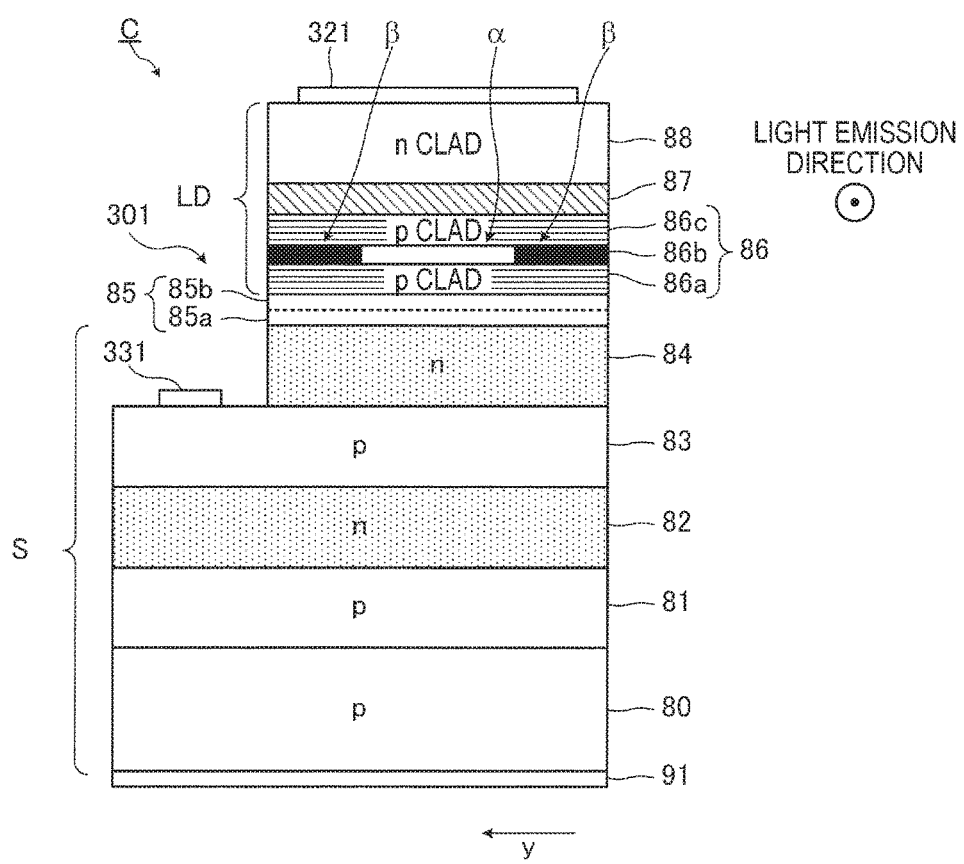
FIG. 19 is an enlarged cross-sectional view of an island in which a setting thyristor and a laser diode are stacked, for explaining modification 3-2.

FIG. 19 is an enlarged cross-sectional view of the island 301 in which the setting thyristor S and the laser diode LD are staked, for explaining modification 3-2.

In modification 3-2, like modification 2-2 of the light emitting chip C according to the second exemplary embodiment, the lower p (clad) layer 86*a* and the upper p (clad) layer 86*c* of the p anode (clad) layer 86 are configured as the DBR layer. The other configurations are similar to those of the light emitting chip C according to the third exemplary embodiment.

When a wavelength corresponding to the band gap of a semiconductor material which is used in the tunnel junction layer 85 is longer than a light emitting wavelength, light, which reaches the tunnel junction layer 85, is absorbed at a band edge to be lost. For this reason, in modification 3-1, the DBR layer is provided between the light emitting layer 87 and the tunnel junction layer 85, and the tunnel junction layer 85 is provided at a position corresponding to a node of a standing wave occurring in the DBR layer. As a result, the band edge absorption caused by the semiconductor material used for the tunnel junction layer 85 is greatly suppressed.

Modification 3-2 is manufactured in the same way as modification 2-2 of the light emitting chip C according to the second exemplary embodiment. Further, the n anode (clad) layer 88 may be formed as the clad layer.

The current confining layer 86*b*, which is provided in the p anode (clad) layer 86 of the laser diode LD, may be provided in the n cathode (clad) layer 88 of the laser diode ID, and may also be provided in the p anode layer 81 or the n cathode layer 84 of the setting thyristor S.

(Modification 3-3 of Light Emitting Chip C according to Third Exemplary Embodiment)

Figure 20:
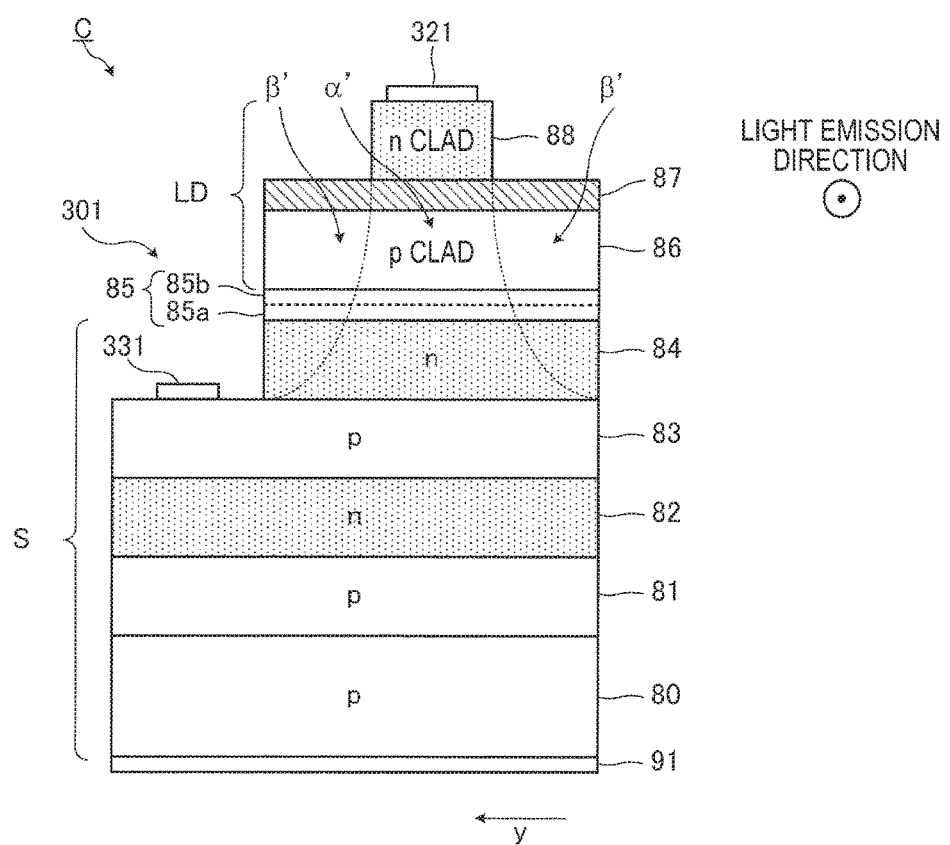
FIG. 20 is an enlarged cross-sectional view of an island in which a setting thyristor and a laser diode are stacked, for explaining modification 3-3.

FIG. 20 is an enlarged cross-sectional view of the island 301 in which the setting thyristor S and the laser diode LD are stacked, for explaining modification 3-3.

In modification 3-3, the current confining layer 86*b* in the light emitting chip C according to the third exemplary embodiment is not used. Instead, the surface area of the n cathode (clad) layer 88 is small. The other configurations are similar to those of the light emitting chip C according to the first exemplary embodiment.

This structure is similar to a ridge waveguide.

As a result, the current flowing in the laser diode LD flows from the n cathode (clad) layer 88. Therefore, as illustrated in FIG. 20, the central portion of the laser diode AD is a current passing region (part) α', and the peripheral portion of the laser diode LD is a current blocking region (part) β'. That is, like the light emitting chip C according to the third exemplary embodiment using the current confining layer 86*b* or modification 3-1 using the tunnel junction layer 85 at the central portion of the laser diode LD, the current path is confined.

In modification 3-3, the light emitting chip is manufactured by changing the method of manufacturing the light emitting chip C according to the first exemplary embodiment as illustrated in FIG. 10. Since the current confining layer 86*b* is not used, the manufacturing process is simplified.

Since the current confining layer 86*b* is not used, it is easy to apply modification 3-3 to a semiconductor material on the substrate, such as InP, GaN, sapphire, or the like, to which the vapor oxidation is difficult to be applied.

(Modification 3-4 of Light Emitting Chip C according to Third Exemplary Embodiment)

Figure 21:
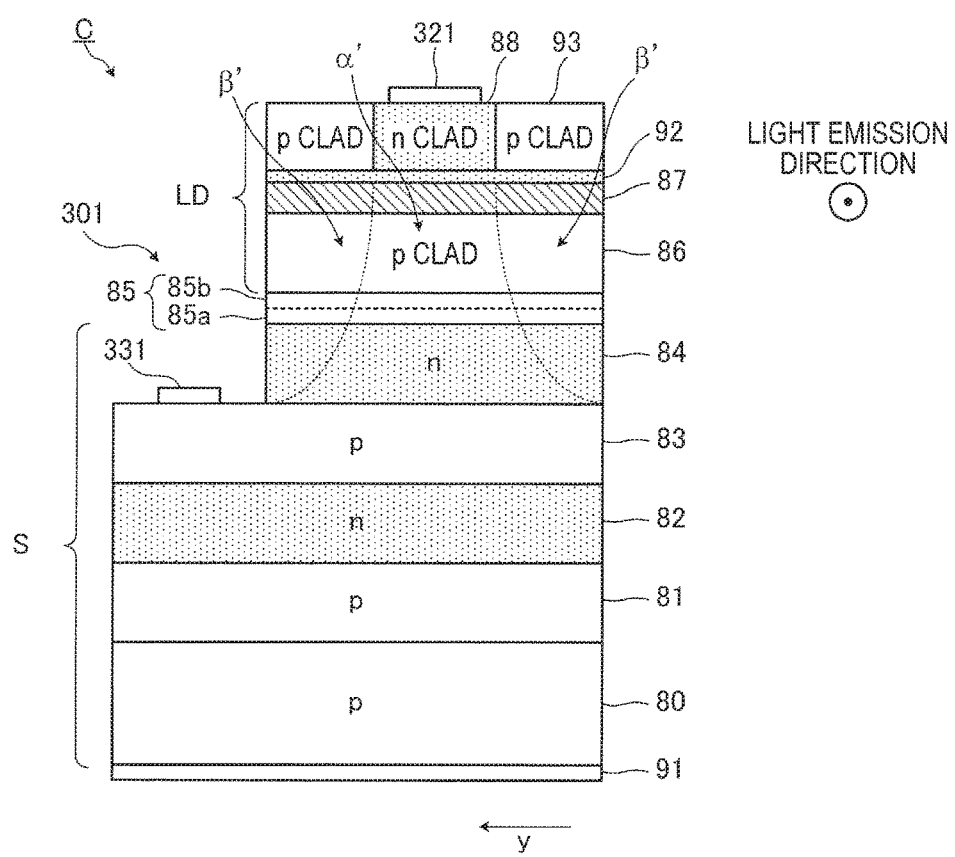
FIG. 21 is an enlarged cross-sectional view of an island in which a setting thyristor and a laser diode are stacked, for explaining modification 3-4.

FIG. 21 is an enlarged cross-sectional view of the island 301 in which the setting thyristor S and the laser diode AD are stacked, for explaining modification 3-4.

In modification 3-4, an n cathode (clad) layer 92 is provided on the light emitting layer 87 of modification 3-3, and then the n cathode (clad) layer 88 having a reduced area is provided. Further, a p anode (clad) layer 93 similar to the p anode (clad layer) 86 is buried around the n cathode (clad) layer 88. The other configurations are similar to those of the light emitting chip C according to the first exemplary embodiment.

Since the n cathode (clad) layer 88 and the n cathode (clad) layer 92, and the p clad layer 93 form a pn junction, the current is restricted to a side of the n cathode (clad) layer 88. Therefore, like the case where the current confining layer is provided, power consumed by the non-light-emitting recombination is suppressed, and as a result, the power consumption is reduced, and the light extraction efficiency is improved.

This structure is similar to an embedded waveguide.

Modification 3-4 may form the n cathode (clad) layer 92 and the embedded p anode (clad) layer 93 in modification 3-3.

Since the current confining layer 86*b* is not used, it is easy to apply modification 3-4 to a semiconductor material on the substrate, such as InP, CaN, sapphire, or the like, to which the vapor oxidation is difficult to be applied.

Fourth Exemplary Embodiment

In a light emitting chip C according to a fourth exemplary embodiment, a vertical cavity surface emitting laser (VCSEL) is used as the light emitting element instead of the light emitting diodes LED in the first exemplary embodiment and the second exemplary embodiment and the laser diode LD in the third exemplary embodiment.

The other configurations except for the light emitting chip C are similar to those in the first exemplary embodiment. Therefore, the light emitting chip C will be described, and the descriptions of similar parts wall be omitted.

Figure 22:
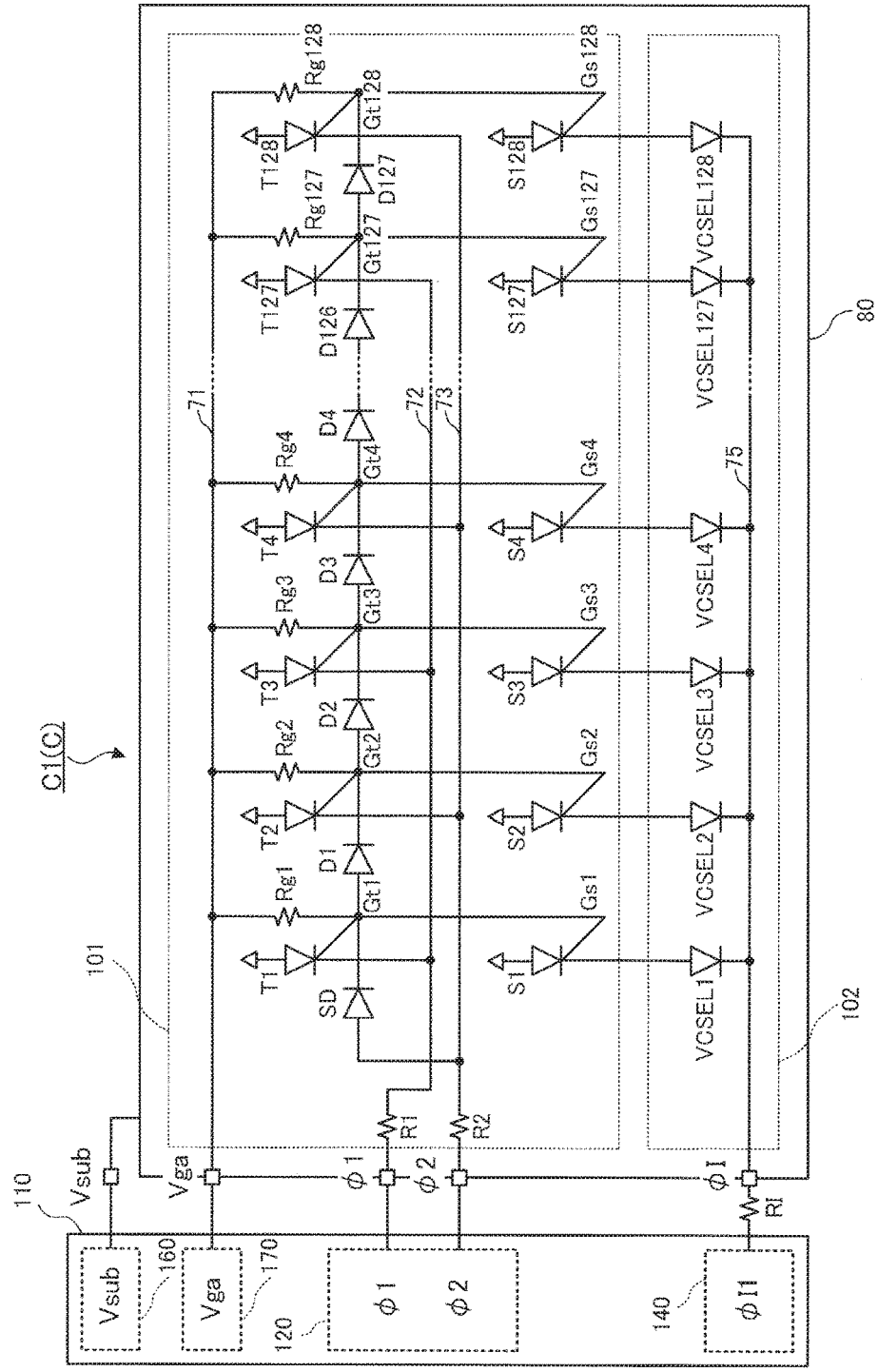
FIG. 22 is an equivalent circuit diagram for explaining a circuit configuration of the light emitting chip equipped with a self-scanning light-emitting device (SLED) array according to a fourth exemplary embodiment.

FIG. 22 is an equivalent circuit diagram for explaining a circuit configuration of the light emitting chip C equipped with a self-scanning light-emitting device (SLED) array according to the fourth exemplary embodiment. The light emitting diodes LED1-LED128 in FIG. 5 in the first exemplary embodiment are vertical cavity surface emitting lasers VCSEL 1-VCSEL 128 (referred to as a vertical cavity surface emitting laser VCSEL if not distinguished). Because the other configurations are similar to those in FIG. 5, the descriptions thereof will be omitted.

In the first exemplary embodiment, even in the top plan layout view and the cross-sectional view of the light emitting chip C illustrated in FIGS. 6A and 6B, the vertical cavity surface emitting laser VCSEL maybe substituted for the light emitting diode LED. Therefore, the top plan layout view and the cross-sectional view of the light emitting chip C according to the fourth exemplary embodiment will be omitted.

Figure 23:
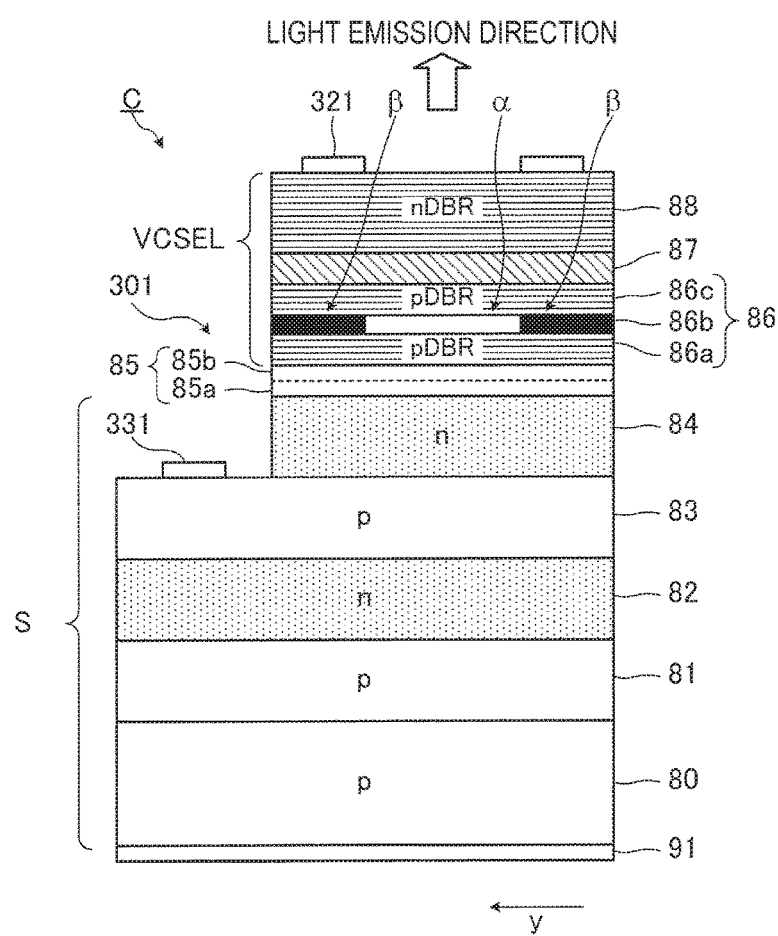
FIG. 23 is an enlarged cross-sectional view of an island in which a setting thyristor and a vertical cavity surface emitting laser of the light emitting chip according to the fourth exemplary embodiment are stacked.

FIG. 23 is an enlarged cross-sectional view of the island 301 in which the setting thyristor S and the vertical cavity surface emitting laser VCSEL of the light emitting chip C according to the fourth exemplary embodiment are stacked.

The setting thyristor S and the vertical cavity surface emitting laser VCSEL are stacked (VCSEL on thyristor).

Because a basic configuration is similar to that of the light emitting chip C according to the second exemplary embodiment as illustrated in FIG. 13, the descriptions thereof will be omitted.

The vertical cavity surface emitting laser VCSEL performs a laser oscillation by resonating light at the light emitting layer 87 interposed between the two DBR layers (the p anode (DBR) layer 86 and the n cathode (DBR) layer 88). The laser oscillation is performed when the reflectivity of the two DBR layers (the p anode (DBR) layer 86 and the n cathode (DBR) layer 88) is equal to or greater 99%, for example.

In the vertical cavity surface emitting laser VCSEL, the p anode (DBR) layer 86 is present between the tunnel junction layer 85 and the light emitting layer 87. For this reason, since light does not reach the tunnel junction layer 85, a band gap of the tunnel junction layer 85 may be smaller than a transmission wavelength of the vertical cavity surface emitting laser VCSEL. Therefore, the resistance of the tunnel junction layer 85 may be reduced.

The light emitting chip C according to the fourth exemplary embodiment operates in accordance with the timing chart in FIG. 9, as described in the first exemplary embodiment.

The current confining layer 86b, which is provided in the p anode (DBR) layer 86 of the vertical cavity surface emitting laser VCSEL, may be provided in the n cathode (DBR) layer 88 of the vertical cavity surface emitting laser VCSEL, and may be provided in the p anode layer 81 or the n cathode layer 84 of the setting thyristor S. In this case, a predetermined amount of light passes through the tunnel junction layer 85. Accordingly, in order to reduce light absorption in the tunnel junction layer 85, the tunnel junction layer 85 may be formed using a material having the band gap which corresponds to a wavelength shorter than an oscillation wavelength, the film thickness may be reduced, or the tunnel junction layer 85 may be located at a node of a standing wave.

Hereinafter, modifications of the light emitting chip C according to the fourth exemplary embodiment will be described. In the modifications described below, portions of the island 301 of the light emitting chip C, where the setting thyristor S and the laser diode LD are stacked, are different. Because the other configurations are similar to those of the light emitting chip C described above, different parts will be described, and descriptions of similar parts will be omitted.

(Modification 4-1 of Light Emitting Chip C according to Fourth Exemplary Embodiment)

Figure 24:
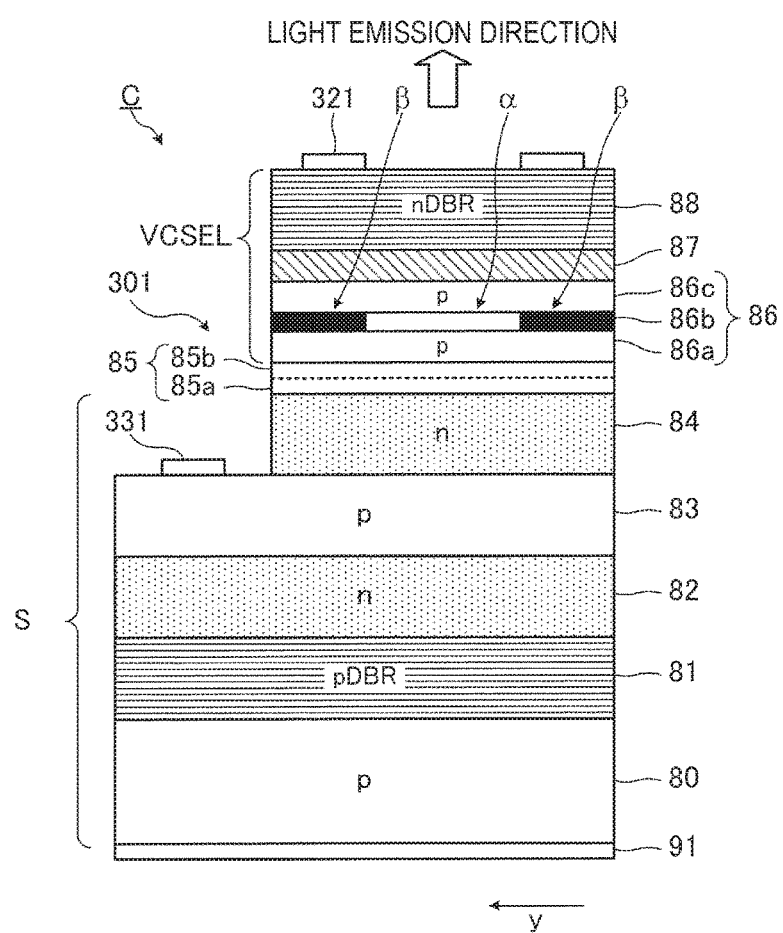
FIG. 24 is an enlarged cross-sectional view of an island in which a setting thyristor and a vertical cavity surface emitting laser are stacked, for explaining modification 4-1.

FIG. 24 is an enlarged cross-sectional view of the island 301 in which the setting thyristor S and the vertical cavity surface emitting laser VCSEL are stacked, for explaining modification 4-1.

Because a basic configuration of modification 4-1 is similar to that of modification 2-1 of the light emitting chip C according to the second exemplary embodiment as illustrated in FIG. 13, the descriptions thereof will be omitted.

The vertical cavity surface emitting laser VCSEL performs a laser oscillation by resonating light at the light emitting layer 87 interposed between the two DBR layers (the p anode (DBR) layer 81 and the n cathode (DBR) layer 88).

The current confining layer 86b, which is provided in the p anode layer 86 of the vertical cavity surface emitting laser VCSEL, may be provided in the n cathode (DBR) layer 88 of the vertical cavity surface emitting laser VCSEL, and may be provided in the p anode layer 81 or the n cathode layer 84 of the setting thyristor S.

(Modification 4-2 of Light Emitting Chip C according to Fourth Exemplary Embodiment)

Figure 25:
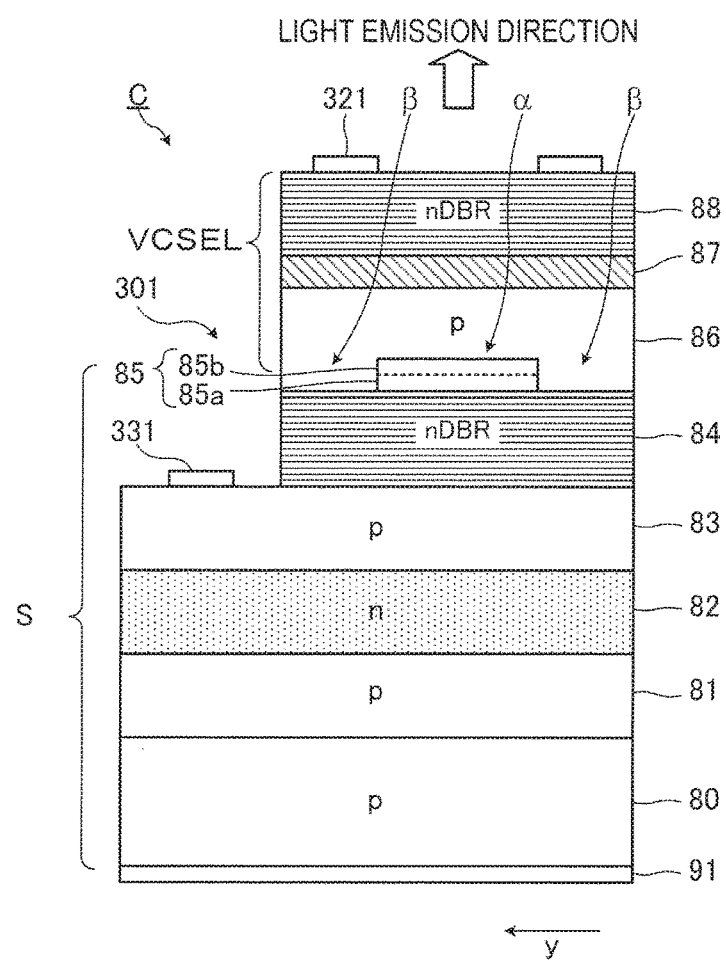
FIG. 25 is an enlarged cross-sectional view of an island in which a setting thyristor and a vertical cavity surface emitting laser are stacked, for explaining modification 4-2.

FIG. 25 is an enlarged cross-sectional view of the island 301 in which the setting thyristor S and the vertical cavity surface emitting laser VCSEL are stacked, for explaining modification 4-2.

A basic configuration of modification 4-2 is similar to that of modification 1-2 of the light emitting chip C according to the first exemplary embodiment as illustrated in. FIG. 12, and the n cathode layer 84 and the n cathode layer 88 are configured as the DBR layer. Because the other configurations are similar to those of modification 1-2, the descriptions thereof will be omitted.

The vertical cavity surface emitting laser VCSEL performs a laser oscillation by resonating light at the two DBR layers (the n cathode (DBR) layer 84 and the n cathode (DBR) layer 88) with the light emitting layer 87 and the p anode layer 86 interposed therebetween.

In modification 4-2, since the current confining layer 86b is not used, it is easy to apply modification 4-2 to a semiconductor material on the substrate, such as InP, GaN, sapphire, or the like, to which the vapor oxidation is difficult to be applied.

Since the tunnel junction layer 85 is used for the current confinement, power consumed by the non-light-emitting recombination is suppressed, and as a result, power consumption is reduced, and light extraction efficiency is improved.

In the first to fourth exemplary embodiments, the conductivity of a light emitting element (a light emitting diode LED, a laser diode LD, or a vertical cavity surface emitting laser VCSEL) and a thyristor (a transfer thyristor T or a setting thyristor S) may be reversed, and the polarity of the circuit may be changed. That is, the anode common may be configured as the cathode common.

In order to suppress delayed light emission or relaxation oscillation when a light emitting element (a light emitting diode LED, a laser diode LD, or a vertical cavity surface emitting lasers VCSEL) is turned on, the light emitting element may be in a slight light emission state or a slight oscillation state by applying a minute current, which is equal to or higher than a threshold value current, in advance to the light emitting element. That is, a configuration may be provided in which the light emitting element is caused to slightly emit light before the setting thyristor S is turned on and the light emitting amount of the light emitting element is increased when the setting thyristor S is turned on so as to set the light amount to a predetermined light amount. In such a configuration, for example, an electrode may be formed on the anode layer of the light emitting element (the light emitting diode LED, the laser diode ID, or the vertical cavity surface emitting laser VCSEL), a voltage source or a current source may be connected to the electrode, and an weak current may be applied to the light emitting element from the voltage source or the current source before the setting thyristor S is turned on.

In the foregoing description, a description has been made with reference to a self-scanning light-emitting device (SLED) array that is configured with a light emitting element (a light emitting diode LED, a laser diode LD, or a vertical cavity surface emitting laser VCSEL) and a thyristor (a transfer thyristor T or a setting thyristor S). However, in addition to the above-mentioned members, the self-scanning light-emitting device (SLED) array may further include other members such as a control thyristor, a diode, and a resistance.

Although it has been described that transfer thyristors T are connected to each other by a coupling diode D, the transfer thyristors T may be connected by a member such as a resistance that may transfer a change in potential.

In addition, in each of the exemplary embodiments, as a structure of a transfer thyristor T and a setting thyristor S, a structure other than a 4-layer structure of pnpn may be applied as long as the structure has the functions of the transfer thyristor T and the setting thyristor S in each of the exemplary embodiments. For example, a pinin structure, a pipin structure, an npip structure, a pnin structure, or the like, which has thyristor characteristics, maybe applied. In this case, any layer among an i layer, an n layer, and an i layer, which are interposed between the p and the n of the pinin structure, and an n layer and an i layer, which are interposed between the p and the n of the pnin structure, may be configured as a gate layer, and an n ohmic electrode 332 provided on the gate layer may be configured as a terminal of the gate Gt (gate Gs). Alternatively, any layer among an i layer, a p layer, and an i layer, which are interposed between the n and the p of the npip structure, and a p layer and an i layer, which are interposed between the n and the p of the npip structure, may be configured as a gate layer, and the p ohmic electrode 332 provided on the gate layer may be configured as a terminal of the gate Gt (gate Gs).

In each of the exemplary embodiments, a semiconductor structure in which plural semiconductor layers constituting a thyristor and plural semiconductor layers constituting a light emitting element are stacked through a semiconductor layer constituting a tunnel junction, may also be used for an application other than the self-scanning light-emitting device (SLED) array. For example, the semiconductor structure may be used as a single light emitting element that is turned ON based on an input of an electrical signal, an optical signal, or the like from the outside, or as a light emitting element array other than the self-scanning light-emitting device array.

In the foregoing description, a p-type GaAs has been mainly described as an example of the substrate 80. Descriptions will be made on an example of each semiconductor layer (a semiconductor stacked body formed in the process of forming the semiconductor stacked body in FIG. 10A) in a case where the other substrates are used.

First, an example of a semiconductor stacked body in a case of using a GaN substrate is as follows.

For example, the p anode layer 81 is p-type $Al_{0.9}GaN$ having an impurity concentration of $1\times10^{18}/cm^3$. The Al composition may be changed within a range from 0 to 1.

For example, the n gate layer 82 is n-type $Al_{0.9}GaN$ having an impurity concentration of $1\times10^{17}/cm^3$. The Al composition may be changed within a range from 0 to 1.

For example, the p gate layer 83 is p-type $Al_{0.9}GaN$ having an impurity concentration of $1\times10^{17}/cm^3$. The Al composition may be changed within a range from 0 to 1.

For example, the n cathode layer 84 is n-type $Al_{0.9}GaN$ having an impurity concentration $1\times10^{18}/cm^3$. The Al composition may be changed within a range from 0 to 1.

The tunnel junction layer 85 is configured with a junction (see FIG. 10B) between the $n^{++}$ layer 85a formed by adding the n-type impurity at a high concentration and the $p^{++}$ layer 85b formed by adding the n-type impurity at a high concentration. For example, the $n^{++}$ layer 85a and the $p^{++}$ layer 85b have a high impurity concentration of $1\times10^{20}/cm^3$. Further, the impurity concentration of a typical junction is $10^{17}/cm^3$ to $10^{18}/cm^3$. The combinations of the $n^{++}$ layer 85a and the $p^{++}$ layer 85b (hereinafter, referred to as $n^{++}$ layer 85a/$p^{++}$ layer 85b) may include, for example, $n^{++}GaN/p^{++}GaN$, $n^{++}GaInN/p^{++}GaInN$, and $n^{++}AlGaN/p^{++}AlGaN$. Further, the combinations may be changed to each other.

The p anode layer 86 is configured so that the lower p layer 86a, the current confining layer 86b, and the upper p layer 86c are stacked sequentially (see FIG. 10C).

For example, the lower p layer 86a and the upper p layer 86c are p-type $Al_{0.9}GaN$ having an impurity concentration $1\times10^{18}/cm^3$. The Al composition may be changed within a range from 0 to 1.

Because it is difficult to use an oxidation confinement layer on the GaN substrate as the current confining layer, the structures of FIGS. 12, 18, 20, 21, 25, and the like, which use a tunnel junction, a ridge type structure, or an embedded structure as a current confining layer, are preferred structures. Alternatively, it is also effective to use ion implantation as a current confinement method.

The light emitting layer 87 is a quantum well structure in which a well layer and a barrier layer are alternately stacked. For example, the well layer is GaN, InGaN, AlGaN, or the like, and the barrier layer is AlGaN, GaN, or the like. Further, the light emitting layer 87 may be a quantum line (quantum wire) or a quantum box (quantum dot).

For example, the n cathode layer 88 is n-type $Al_{0.9}GaN$ having an impurity concentration $1\times10^{18}/cm^3$. The Al composition may be changed within a range from 0 to 1.

First, an example of the semiconductor stacked body in a case where an InP substrate is used is as follows.

For example, the p anode layer 81 is p-type InGaAsP having impurity concentration of $1\times10^{18}/cm^3$. The Ga composition and the Al composition may be changed within a range from 0 to 1.

For example, the n gate layer 82 is n-type InGaAsP having an impurity concentration of $1\times10^{17}/cm^3$. The Ga composition and the Al composition may be changed within a range from 0 to 1.

For example, the p gate layer 83 is p-type InGaAsP having an impurity concentration of $1\times10^{17}/cm^3$. The Ga composition and the Al composition may be changed within a range from 0 to 1.

For example, the n cathode layer 84 is n-type InGaAsP having an impurity concentration of $1\times10^{18}/cm^3$. The Ga composition and the Al composition may be changed within a range from 0 to 1.

The tunnel junction layer 85 is configured with a junction (see FIG. 10B) between the $n^{++}$ layer 85a formed by adding the n-type impurity at a high concentration and the $p^{++}$ layer 85b formed by adding the n-type impurity at a high concentration. For example, the $n^{++}$ layer 85a and the $p^{++}$ layer 85b have a high impurity concentration of $1\times10^{20}/cm^3$. Further, the impurity concentration of a typical junction is $10^{17}/cm^3$ to $10^{18}/cm^3$. The combinations of the $n^{++}$ layer 85a and the $p^{++}$ layer 85b (hereinafter, referred to as $n^{++}$ layer 85a/$p^{++}$ layer 85b) may include, for example, $n^{++}InP/p^{++}InP$, $n^{++}InAsP/p^{++}InAsP$, $n^{++}InGaAsP/p^{++}InGaAsP$, and $n^{++}InGaAsPSb/p^{++}InGaAsPSb$. Further, the combinations may be changed to each other.

The p anode layer 86 is configured so that the lower p layer 86a, the current, confining layer 86b, and the upper p layer 86c are stacked sequentially (see FIG. 10C).

For example, the lower p layer 86a and the upper p layer 86c are p-type InGaAsP having an impurity concentration of $1\times10^{18}/cm^3$. The Ga composition and the Al composition may be changed within a range from 0 to 1.

Because it is difficult to use an oxidation confinement layer on the InP substrate as the current confining layer, the structures of FIGS. 12, 18, 20, 21, 25, and the like, which use a tunnel junction, a ridge type structure, or an embedded structure as the current confining layer, are preferred structures. Alternatively, it is also effective to use ion implantation as a current confinement method.

The light emitting layer 87 is a quantum well structure in which a well layer and a barrier layer are alternately stacked. For example, the well layer is InAs, InGaAsP, GaInAs, GaInAsPSb, or the like, and the barrier layer is InP, InAsP, InGaAsP, AlGaInAsP, or the like. Further, the light emitting layer 87 may be a quantum line (quantum wire) or a quantum box (quantum dot).

For example, the n cathode layer 88 is n-type InGaAsP having an impurity concentration of $1\times10^{18}/cm^3$. The Ga composition and the Al composition may be changed within a range from 0 to 1.

For example, the semiconductor layers are stacked by metal organic chemical vapor deposition (MOCVD), molecular beam epitaxy (MBE), or the like, so as to form a semiconductor stacked body.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting component comprising:
   a plurality of transfer elements configured to be sequentially brought into an ON state;
   a plurality of setting thyristors connected to the plurality of transfer elements, respectively, and configured to be brought into a state where the setting thyristors are capable of changing to the ON state when the transfer elements are brought into the ON state; and
   a plurality of light emitting elements stacked on the plurality of setting thyristors through tunnel junctions, respectively, and configured to emit light or increase a light emission amount when the setting thyristors are brought into the ON state.

2. The light emitting component according to claim 1, wherein a plurality of semiconductor layers that constitute each setting thyristor and a plurality of semiconductor layers that constitute the corresponding light emitting element are stacked through a semiconductor layer that constitutes the corresponding tunnel junction.

3. The light emitting component according to claim 2, wherein the tunnel junction is configured to be set to reverse bias when the light emitting element is set to forward bias.

4. The light emitting component according to claim 3, wherein any semiconductor layer among the plurality of semiconductor layers that constitutes each setting thyristor, the plurality of semiconductor layers that constitutes the corresponding light emitting element, and the semiconductor layer that constitutes the tunnel junction confines a current path in the light emitting element.

5. The light emitting component according to claim 4, wherein the semiconductor layer that constitutes the corresponding tunnel junction confines the current path in each light emitting element.

6. The light emitting component according to claim 2, wherein any semiconductor layer among the plurality of semiconductor layers that constitutes each setting thyristor, the plurality of semiconductor layers that constitutes the corresponding light emitting element, and the semiconductor layer that constitutes the tunnel junction confines a current path in the light emitting element.

7. The light emitting component according to claim 6, wherein the semiconductor layer that constitutes the corresponding tunnel junction confines the current path in each light emitting element.

8. The light emitting component according to claim 1, wherein the tunnel junction is configured to be set to reverse bias when the light emitting element is set to forward bias.

9. The light emitting component according to claim 8, wherein any semiconductor layer among a plurality of semiconductor layers that constitutes each setting thyristor, a plurality of semiconductor layers that constitutes the corresponding light emitting element, and a semiconductor layer that constitutes the tunnel junction confines a current path in the light emitting element.

10. The light emitting component according to claim 9, wherein the semiconductor layer that constitutes the corresponding tunnel junction confines the current path in each light emitting element.

11. The light emitting component according to claim 1, wherein any semiconductor layer among a plurality of semiconductor layers that constitutes each setting thyristor, a plurality of semiconductor layers that constitutes the corresponding light emitting element, and a semiconductor layer that constitutes the tunnel junction confines a current path in the light emitting element.

12. The light emitting component according to claim 11, wherein the semiconductor layer that constitutes the corresponding tunnel junction confines the current path in each light emitting element.

13. The light emitting component according to claim 1, wherein a part or an entirety of at least one semiconductor layer among a plurality of semiconductor layers that constitute each setting thyristor and a plurality of semiconductor layers that constitute the corresponding light emitting element is a distributed Bragg reflector layer.

14. The light emitting component according to claim 1, wherein
   each tunnel junction is configured with a plurality of semiconductor layers, and
   a wavelength that corresponds to a band gap of at least one semiconductor layer among the plurality of semiconductor layers of each tunnel junction is longer than a wavelength of light emitted from the corresponding light emitting element.

15. The light emitting component according to claim 1, wherein each tunnel junction is located at a node of a standing wave generated by light emission from the corresponding light emitting element.

16. A print head comprising:
   a light emitting unit including
      a plurality of transfer elements configured to be sequentially brought into an ON state,
      a plurality of setting thyristors connected to the plurality of transfer elements, respectively, and configured to be brought into a state where the setting thyristors are capable of changing to the ON state when the transfer elements are brought into the ON state, and a plurality tight emitting elements stacked on the plurality of setting thyristors through tunnel junctions, respectively, and configured to emit light or increase a light emission amount when the setting thyristors are brought into the ON state; and an optical unit configured to form an image by using light emitted from the light emitting unit.

17. An image forming apparatus comprising:

an image carrier;

a charging unit configured to charge the image carrier;

an exposing unit including a plurality of transfer elements configured to be sequentially brought into an ON state, a plurality of setting thyristors connected to the plurality of transfer elements, respectively, and configured to be brought into a state where the setting thyristors are capable of changing to the ON state when the transfer elements are brought into the ON state, and a plurality of light emitting elements stacked on the plurality of setting thyristors through tunnel junctions, respectively, and configured to emit light or increase a light emission amount when the setting thyristors are brought into the ON state, the exposing unit configured to expose the image carrier through an optical unit;

a developing unit configured to develop an electrostatic latent image formed on the image carrier exposed by the exposing unit; and a transfer unit configured to transfer the image developed on the image carrier to a transfer target member.

* * * * *